(12) United States Patent
Yang et al.

(10) Patent No.: US 12,272,770 B2
(45) Date of Patent: Apr. 8, 2025

(54) DISPLAY DEVICE

(71) Applicant: SAMSUNG DISPLAY CO., LTD., Yongin-si (KR)

(72) Inventors: Eun A Yang, Yongin-si (KR); Han Su Kim, Yongin-si (KR); Jong Hyuk Kang, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 481 days.

(21) Appl. No.: 17/783,969

(22) PCT Filed: Nov. 27, 2020

(86) PCT No.: PCT/KR2020/017173
§ 371 (c)(1),
(2) Date: Jun. 9, 2022

(87) PCT Pub. No.: WO2021/118131
PCT Pub. Date: Jun. 17, 2021

(65) Prior Publication Data
US 2023/0033767 A1 Feb. 2, 2023

(30) Foreign Application Priority Data

Dec. 12, 2019 (KR) ........................ 10-2019-0166082

(51) Int. Cl.
*H01L 33/38* (2010.01)
*H01L 27/15* (2006.01)
(Continued)

(52) U.S. Cl.
CPC .......... *H01L 33/382* (2013.01); *H01L 27/156* (2013.01); *H01L 33/20* (2013.01); *H01L 33/62* (2013.01)

(58) Field of Classification Search
CPC ....... H01L 33/382; H01L 33/20; H01L 33/62; H01L 33/44; H01L 33/36; H01L 33/40;
(Continued)

(56) References Cited

U.S. PATENT DOCUMENTS 8,872,214 B2  10/2014 Negishi et al.
9,024,334 B2   5/2015 Agatani et al.
(Continued)

FOREIGN PATENT DOCUMENTS

EP     4 047 658      8/2022
JP     2011-108744    6/2011
(Continued)

OTHER PUBLICATIONS

International Search Report, with English translation, corresponding to International Application No. PCT/KR2020/017173 dated Mar. 8, 2021.
(Continued)

*Primary Examiner* — Kyoung Lee
*Assistant Examiner* — Christina A Sylvia
(74) *Attorney, Agent, or Firm* — KILE PARK REED & HOUTTEMAN PLLC

(57) ABSTRACT

A display device may include pixels disposed on a substrate. Each of the pixels may include a first electrode, a second electrode spaced apart from the first electrode and enclosing a perimeter of the first electrode, light emitting elements disposed between the first electrode and the second electrode, and each including a first end and a second end, a third electrode overlapping the first electrode and the first end of each of the light emitting elements in a plan view, and electrically contacting the first electrode and the first end of each of the light emitting elements, and a fourth electrode overlapping the second electrode and the second end of each of the light emitting elements in a plan view, and electrically
(Continued)

contacting the second electrode and the second end of each of the light emitting elements. The light emitting elements may be radially disposed around the first electrode.

25 Claims, 27 Drawing Sheets

(51) Int. Cl.
*H01L 33/20* (2010.01)
*H01L 33/62* (2010.01)

(58) Field of Classification Search
CPC ....... H01L 33/43; H01L 33/14; H01L 27/156; H01L 27/1218; H01L 27/124; H01L 25/0753; H01L 21/28; H01L 21/76895
See application file for complete search history.

(56) References Cited

U.S. PATENT DOCUMENTS

| | | | |
|---|---|---|---|
| 9,112,112 B2 | 8/2015 | Do et al. | |
| 9,773,761 B2 | 9/2017 | Do | |
| 10,249,603 B2 | 4/2019 | Cho et al. | |
| 10,461,123 B2 | 10/2019 | Kim et al. | |
| 10,497,680 B2 | 12/2019 | Sung et al. | |
| 10,818,647 B2 | 10/2020 | Kim et al. | |
| 10,943,947 B2 * | 3/2021 | Im | H01L 25/0753 |
| 11,984,548 B2 * | 5/2024 | Lee | H01L 27/1244 |
| 12,057,526 B2 * | 8/2024 | Lee | H01L 33/42 |
| 2011/0019420 A1 | 1/2011 | Kadotani et al. | |
| 2011/0089850 A1 | 4/2011 | Shibata et al. | |
| 2016/0086928 A1 | 3/2016 | Agatani et al. | |
| 2018/0175104 A1 | 6/2018 | Kang et al. | |
| 2021/0242380 A1 | 8/2021 | Kim et al. | |

FOREIGN PATENT DOCUMENTS

| | | | |
|---|---|---|---|
| KR | 10-1244926 | 3/2013 | |
| KR | 10-1490758 | 2/2015 | |
| KR | 1020180072909 | * 12/2016 | ............ H01L 33/40 |
| KR | 10-1782889 | 9/2017 | |
| KR | 10-2018-0007025 | 1/2018 | |
| KR | 10-2018-0077114 | 7/2018 | |
| KR | 10-1987196 | 6/2019 | |
| KR | 10-2019-0124359 | 11/2019 | |

OTHER PUBLICATIONS

Written Opinion, with English translation, corresponding to International Application No. PCT/KR2020/017173, dated Mar. 8, 2021.

* cited by examiner

DISPLAY DEVICE

CROSS-REFERENCE TO RELATED APPLICATION(S)

This application is a national entry of International Application No. PCT/KR2020/017173, filed on Nov. 27, 2020, which claims under 35 U.S.C. §§ 119(a) and 365(b) priority to and benefits of Korean Patent Application No. 10-2019-0166082, filed on Dec. 12, 2019, in the Korean Intellectual Property Office (KIPO), the entire contents of which are incorporated herein by reference.

BACKGROUND

1. Technical Field

Various embodiments of the disclosure relate to a display device.

2. Description of Related Art

Recently, interest in information displays is increasingly growing. Hence, research and development on display devices have been continuously performed.

In case that light emitting elements are disposed to be biased in a specific direction, light emitted from the light emitting elements may be focused in the specific direction, and a light output distribution of the display device may not be uniform.

SUMMARY

An object of the disclosure is to provide a display device having a uniform light output distribution.

Another object of the disclosure is to provide a display device in which a disposition area of light emitting elements may be increased.

The objects of the disclosure are not limited to the above-stated object, and those skilled in the art will clearly understand other not mentioned objects from the accompanying claims.

In order to accomplish the above objects, a display device in accordance with an embodiment of the disclosure may include pixels disposed on a substrate. Each of the pixels may include a first electrode, a second electrode spaced apart from the first electrode and enclosing a perimeter of the first electrode, light emitting elements disposed between the first electrode and the second electrode, and each including a first end and a second end, a third electrode overlapping the first electrode and the first end of each of the light emitting elements in a plan view, and electrically contacting the first electrode and the first end of each of the light emitting elements, and a fourth electrode overlapping the second electrode and the second end of each of the light emitting elements in a plan view, and electrically contacting the second electrode and the second end of each of the light emitting elements. The light emitting elements may be radially disposed around the first electrode.

The first electrode may include a first center electrode having a circular shape in a plan view, a first peripheral electrode enclosing at least a portion of the first center electrode, and a first connection electrode electrically connecting the first center electrode and the first peripheral electrode to each other.

The second electrode may include a second center electrode enclosing at least a portion of the first center electrode, a second peripheral electrode enclosing at least a portion of the second center electrode, and a second connection electrode electrically connecting the second center electrode and the second peripheral electrode to each other.

The second center electrode may have a ring shape that is open on at least one side in a plan view.

The first peripheral electrode may enclose at least a portion of the second center electrode, and have a ring shape that is open on at least one side in a plan view.

The second peripheral electrode may be disposed outside the first peripheral electrode.

The light emitting elements may be disposed in at least one of an area between the first center electrode and the second center electrode, an area between the second center electrode and the first peripheral electrode, and an area between the first peripheral electrode and the second peripheral electrode.

The display device may further include an insulating layer disposed on the first electrode and the second electrode. The insulating layer may include a first opening exposing at least a portion of the first electrode, and a second opening exposing at least a portion of the second electrode. The third electrode may electrically contact the first electrode through the first opening. The fourth electrode may electrically contact the second electrode through the second opening.

The display device may further include a fixing layer disposed on the insulating layer and the light emitting elements. The fixing layer may contact at least a portion of an outer circumferential surface of each of the light emitting elements and allow the first end and the second end to be exposed.

The fixing layer may include organic material, and at least a portion of the fixing layer may be disposed between the light emitting elements and the insulating layer.

The fixing layer may include inorganic material, and a void may be at least partially disposed between the light emitting elements and the insulating layer.

Each of the pixels may further include a first bank disposed between the substrate and the first electrode, and a second bank disposed between the substrate and the second electrode. The light emitting elements may be disposed between the first bank and the second bank.

The display device may further include a partition wall enclosing at least some of the pixels, and disposed on the insulating layer. At least a portion of the second bank may overlap the partition wall in a plan view.

The fourth electrode may be spaced apart from the third electrode, and disposed to enclose a perimeter of the third electrode.

The display device may further include an insulating pattern disposed between the third electrode and the fourth electrode. The insulating pattern may be disposed on one of the third and the fourth electrodes. Another one of the third and the fourth electrodes may be disposed on the insulating pattern.

The display device may further include a driving transistor disposed between the substrate and the unit pixels, and electrically connected to the light emitting elements. The driving transistor may include a semiconductor pattern disposed on the substrate, a gate electrode disposed on the semiconductor pattern, and a first transistor electrode and a second transistor electrode disposed on the gate electrode. The semiconductor pattern may include a first area electrically contacting the first transistor electrode, a second area spaced apart from the first area and electrically contacting the second transistor electrode, and a channel area disposed between the first area and the second area. The first transistor electrode may be electrically connected to a first bridge line disposed on a layer different from the first transistor electrode. The first bridge line may be electrically connected to one of the first electrode and the second electrode.

The first bridge line may electrically contact the first electrode through a contact hole overlapping the first electrode in a plan view.

The first transistor electrode may be electrically connected to a second bridge line, the second bridge line and the first transistor electrode being disposed on a same layer. The second bridge line may be electrically connected to the first electrode. The first bridge line may be electrically connected to the second electrode.

In order to accomplish the above objects, a display device in accordance with an embodiment of the disclosure may include pixels disposed on a substrate. Each of the pixels may include a first electrode having a spiral shape wound in a direction that is a clockwise direction or a counterclockwise direction and receding from a center point in a plan view, a second electrode having a spiral shape wound in a direction identical to the direction of the first electrode and receding from the center point in a plan view, and spaced apart from the first electrode, and light emitting elements disposed between the first electrode and the second electrode.

The pixels may include a first pixel, and a second pixel adjacent to the first pixel. A direction in which the first electrode and the second electrode of the first pixel are wound may differ from a direction in which the first electrode and the second electrode of the second pixel are wound.

The light emitting elements may be radially disposed around the center point.

The light emitting elements each may include a first end and a second end. Each of the pixels may include a third electrode overlapping the first end of each of the light emitting elements and the first electrode, and electrically contacting the first electrode and the first end of each of the light emitting elements, and a fourth electrode overlapping the second end of each of the light emitting elements and the second electrode in a plan view, and electrically contacting the second electrode and the second end of each of the light emitting elements, and spaced apart from the third electrode.

The third and the fourth electrodes each may have a spiral shape wound in a direction identical to a direction of the first and the second electrodes and receding from the center point in a plan view.

Each of the unit pixels may include a first bank disposed between the substrate and the first electrode, and a second bank disposed between the substrate and the second electrode. The light emitting elements may be disposed between the first bank and the second bank.

The first and the second banks each may have a spiral shape wound in a direction identical to a direction of the first and the second electrodes and receding from the center point in a plan view.

Details of various embodiments are included in the detailed descriptions and drawings.

In various embodiments of the disclosure, light emitting elements between a first electrode and a second electrode enclosing the first electrode may be radially disposed around the first electrode. Therefore, light emitted from the light emitting elements may be prevented from being focused in a specific direction, and a display device having a uniform light output distribution may be provided.

Furthermore, various embodiments of the disclosure may provide a display device, in which the first electrode and the second electrode each includes a center electrode, a peripheral electrode, and a connection electrode, so that space in which the light emitting elements can be validly disposed between the first electrode and the second electrode may be enhanced, and a display luminance of the display device may be enhanced.

In addition, embodiments of the disclosure may provide a display device, in which the first electrode and the second electrode have spiral shapes wound in the same direction while receding from a center point in a plan view, so that the space in which the light emitting elements can be validly disposed between the first electrode and the second electrode may be enhanced, and the display luminance of the display device may be enhanced.

The effects of the disclosure are not limited by the foregoing, and other various effects are anticipated herein.

DETAILED DESCRIPTION OF THE EMBODIMENTS

Figure 1A:
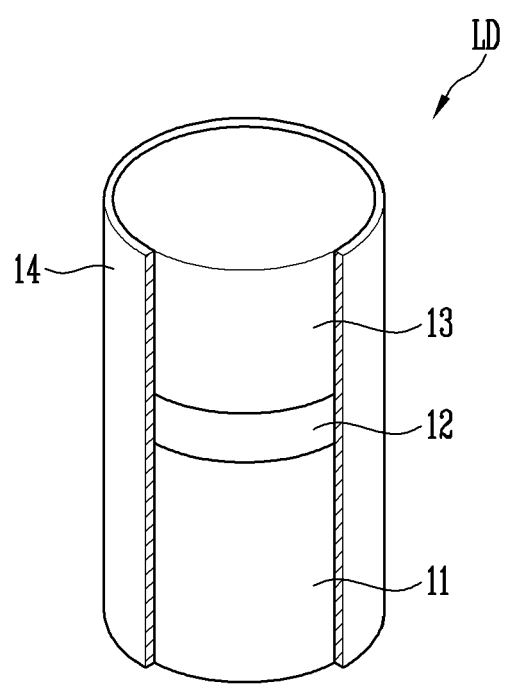
FIGS. 1A and 1B are schematic perspective views illustrating a light emitting element in accordance with an embodiment.

Advantages and features of the disclosure, and methods for achieving the same will be described with reference to embodiments described later in detail together with the accompanying drawings. The disclosure may, however, be embodied in many different forms and should not be construed as being limited to the embodiments set forth herein. Rather, these embodiments are provided so that this disclosure will be thorough and complete and will convey the concept of the disclosure to those skilled in the art, and the claimed invention will be defined by the appended claims.

It will be understood that in case that an element or a layer is referred to as being "on" another element or a layer, it can be directly on, connected to, or coupled to the other element or the layer, or one or more intervening elements or layers may be present. Like reference numerals refer to like elements throughout. The shapes, sizes, ratios, angles, numbers, etc. of components given in the drawings to describe embodiments are only for illustrative purposes, and the disclosure is not limited to those shown in the drawings.

It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. In the disclosure, the singular forms are intended to include the plural forms as well, unless the context clearly indicates otherwise.

The features of various embodiments of the disclosure can be partially or entirely coupled or combined with each other and can be interlocked and operated in technically various ways. The embodiments can be carried out independently of or in association with each other.

Hereinafter, embodiments of the disclosure will be described in detail with reference to the accompanying drawings. In the drawings, same or similar reference numerals are used to designate the same or similar elements.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
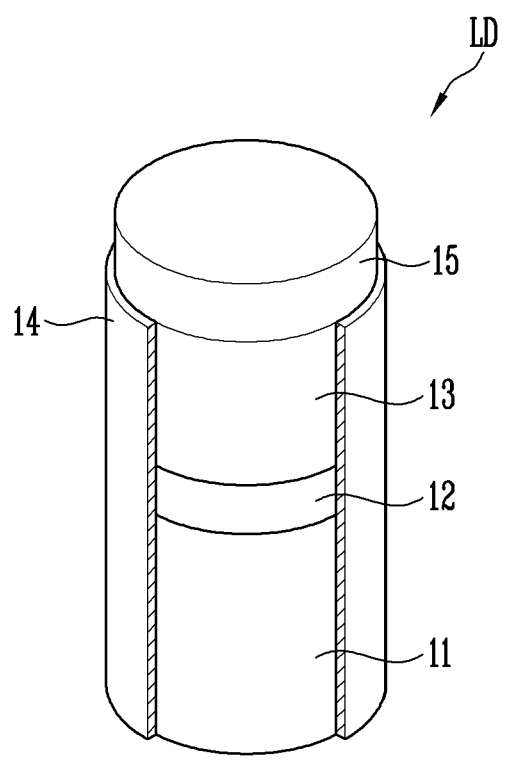

FIGS. 1A and 1B are schematic perspective views illustrating a light emitting element in accordance with an embodiment.

Referring to FIGS. 1A and 1B, a light emitting element LD in accordance with an embodiment may include a first semiconductor layer 11, a second semiconductor layer 13, and an active layer 12 interposed between the first and second semiconductor layers 11 and 13. For example, the light emitting element LD may be implemented as a stack formed by successively stacking the first semiconductor layer 11, the active layer 12, and the second semiconductor layer 13.

In an embodiment, the light emitting element LD may be provided in the form of a rod extending in a direction. If the direction in which the light emitting element LD extends is defined as a longitudinal direction, the light emitting element LD may have a first end and a second end in the longitudinal direction.

In an embodiment, one of the first and second semiconductor layers 11 and 13 may be disposed on the first end, and the other of the first and second semiconductor layers 11 and 13 may be disposed on the second end.

In an embodiment, the light emitting element LD may be provided in the form of a rod. Here, the term "rod type" embraces a rod-like shape and a bar-like shape such as a cylindrical shape and a prismatic shape extending in the longitudinal direction (for example, to have an aspect ratio greater than 1). For example, the length of the light emitting element LD may be greater than the diameter thereof. However, the disclosure is not limited thereto. Furthermore, the light emitting element LD may be a light emitting element having a core-shell structure.

The light emitting element LD may be fabricated to have a diameter and/or length to, e.g., a degree of the microscale or the nanoscale. For example, the diameter of the light emitting element LD may be equal to or less than about 600 nm, and the length of the light emitting element LD may be equal to or less than about 4 μm. However, the size of the light emitting element LD is not limited thereto. For instance, the size of the light emitting element LD may be changed to meet requirements of the display device to which the light emitting element LD is applied.

The first semiconductor layer 11 may include, for example, at least one n-type semiconductor layer. For instance, the first semiconductor layer 11 may include a semiconductor layer which includes at least one semiconductor material of InAlGaN, GaN, AlGaN, InGaN, AlN, and InN, and is doped with a first dopant such as Si, Ge, Se, or Sn. The material forming the first semiconductor layer 11 is not limited thereto, and the first semiconductor layer 11 may be formed of various other materials.

The active layer 12 may be formed on the first semiconductor layer 11 and have a single or multiple quantum well structure. In case that the active layer 12 includes a material having a multiple quantum well structure, the active layer 12 may have a structure formed by alternately stacking quantum layers and well layers.

If an electric field having a voltage or more is applied to the opposite ends of the light emitting element LD, the light emitting element LD may emit light by coupling or combining of electron-hole pairs in the active layer 12. Since light emission of the light emitting element LD can be controlled based on the foregoing principle, the light emitting element LD may be used as a light source for various light emitting devices as well as a pixel of the display device.

The active layer 12 may emit light having a wavelength ranging from about 400 nm to about 900 nm. For example, in case that the active layer 12 emits light having a blue wavelength band, the active layer 12 may include a material such as AlGaN or AlGaInN. Particularly, in case that the active layer 12 has a structure formed by alternately stacking quantum layers and well layers, as a multiple quantum well structure, the quantum layers may include a material such as AlGaN or AlGaInN, and the well layers may include a material such as GaN or AlInN. In an embodiment, the active layer 12 may include AlGaInN as the material of the quantum layers and include AlInN as the material of the well layers. As described above, the active layer 12 may emit blue light having a center wavelength band in a range from about 450 nm to about 495 nm.

However, the disclosure is not limited thereto. The active layer 12 may have a structure formed by alternately stacking semiconductor materials having large energy band gap and semiconductor materials having small energy band gap, and may include groups III to V semiconductor materials depending on the wavelength band of light to be emitted. Light emitted from the active layer 12 is not limited to light having a blue wavelength band, and may be light having a red or green wavelength band in some embodiments.

Light emitted from the active layer 12 may be emitted not only toward an outer surface of the light emitting element LD in the longitudinal direction but also toward opposite sidewalls thereof. The directionality of light emitted from the active layer 12 is not limited to a direction.

The second semiconductor layer 13 may be provided on the active layer 12 and include a semiconductor layer of a type different from that of the first semiconductor layer 11. For example, the second semiconductor layer 13 may include at least one p-type semiconductor layer. For instance, the second semiconductor layer 13 may include a semiconductor layer which includes at least one semiconductor material of InAlGaN, GaN, AlGaN, InGaN, AlN, and InN, and is doped with a second dopant such as Mg, Zn, Ca, or Ba. The material forming the second semiconductor layer 13 is not limited thereto, and the second semiconductor layer 13 may be formed of various other materials.

Although FIGS. 1A and 1B illustrate that the first semiconductor layer 11 and the second semiconductor layer 13 each is formed as (or formed of) a single layer, the disclosure is not limited thereto. For example, the number of layers included in each of the first semiconductor layer 11 and the second semiconductor layer 13 may be increased depending on the material of the active layer 12. For example, the first semiconductor layer 11 and the second semiconductor layer 13 may further include a clad layer or a tensile strain barrier reducing (TSBR) layer.

In an embodiment, the light emitting element LD may not only include the first semiconductor layer 11, the active layer 12, and the second semiconductor layer 13, but may also include another fluorescent layer, another active layer, another semiconductor layer, and/or another electrode layer provided on and/or under each layer.

In an embodiment, the light emitting element LD may further include at least one electrode layer disposed on a first end (or one end) of the second semiconductor layer 13 (e.g., an upper surface of the light emitting element LD) or a first end of the first semiconductor layer 11 (e.g., a lower surface of the light emitting element LD). For example, as illustrated in FIG. 1B, the light emitting element LD may further include an electrode layer 15 disposed on the first end of the second semiconductor layer 13. The electrode layer 15 may be an ohmic electrode, but the disclosure is not limited thereto. For example, the electrode layer 15 may be a Schottky contact electrode. The electrode layer 15 may include a metal or a metal oxide. For example, chromium (Cr), titanium (Ti), aluminum (Al), gold (Au), nickel (Ni), indium tin oxide (ITO), indium zinc oxide (IZO), indium tin zinc oxide (ITZO), and an oxide or alloy thereof may be used alone or in any combination. However, the disclosure is not limited thereto. In an embodiment, the electrode layer 15 may be substantially transparent or translucent. Thereby, light generated from the light emitting element LD may be emitted out of the light emitting element LD after passing through the electrode layer 15.

The light emitting element LD may further include an insulating film 14. However, in an embodiment, the insulating film 14 may be omitted, or may be provided to cover (or overlap, e.g., in a plan view) only some of the first semiconductor layer 11, the active layer 12, and the second semiconductor layer 13. For example, the insulating film 14 may be provided on a portion of the light emitting element LD, other than the opposite ends thereof, so that the opposite ends of the light emitting element LD are exposed.

For the sake of explanation, FIGS. 1A and 1B illustrate the insulting film (or insulating layer) 14 a portion of which has been removed, and actually, the entirety of the side surface of the light emitting element LD may be enclosed by the insulating film 14.

In an embodiment, the insulating film 14 may include a transparent insulating material. For example, the insulating film 14 may include at least one insulating material(s) among $SiO_2$, $Si_3N_4$, $Al_2O_3$, and $TiO_2$, but the disclosure is not limited thereto. In other words, various materials having insulation properties may be employed.

The insulating film 14 may prevent the active layer 12 from short-circuiting due to making contact with a conductive material except the first semiconductor layer 11 and the second semiconductor layer 13. Thanks to the insulating film 14, occurrence of a defect in the surface of the light emitting element LD may be minimized, and thus the lifespan and efficiency of the light emitting element LD may be improved. In case that light emitting elements LD are disposed in close contact with each other, the insulating film 14 may prevent an undesired short circuit from occurring between the light emitting elements LD.

The type, the structure, the shape, etc. of the light emitting element LD in accordance with an embodiment may be changed in various ways.

Figure 2:
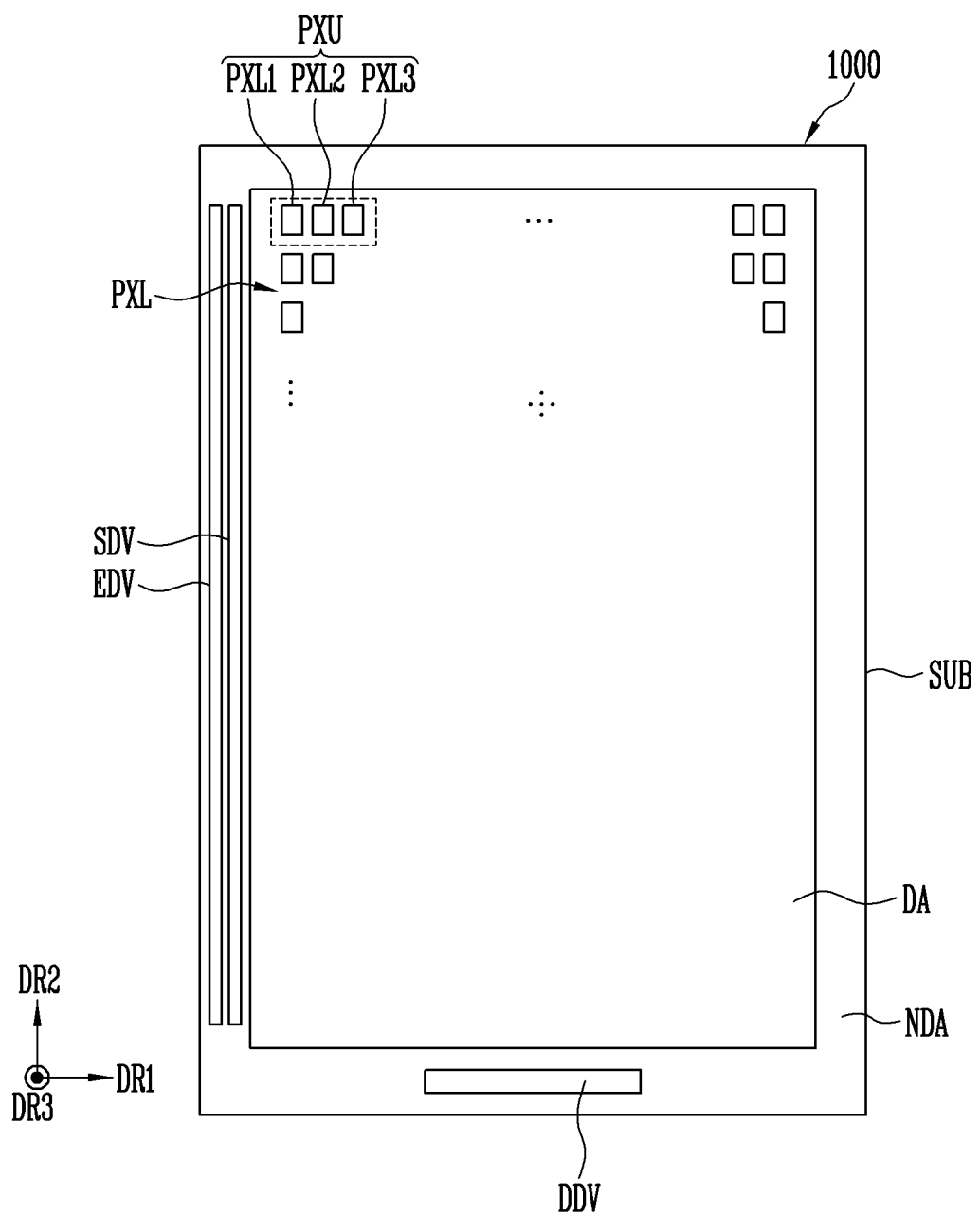
FIG. 2 is a schematic plan view illustrating a display device in accordance with an embodiment.

FIG. 2 is a schematic plan view illustrating a display device in accordance with an embodiment.

Referring to FIGS. 1A to 2, a display device 1000 may include a substrate SUB, and pixels PXL provided on the substrate SUB. In detail, the display device 1000 (or the substrate SUB) may include a display area DA formed to display an image, and a non-display area NDA other than the display area DA.

The display area DA may be an area in which the pixels PXL are provided. The non-display area NDA may be an area in which drivers EDV, SDV and DDV configured to drive the pixels PXL, and various lines for electrically connecting the pixels PXL with the drivers SDV and DDV are provided.

The display area DA may have various shapes. For example, the display area DA may be provided in various forms such as a closed polygon including sides formed as linear lines, a circle, an ellipse or the like including a side formed as a curved line, and a semicircle, a semiellipse or the like including sides formed as a linear line and a curved line.

In case that the display area DA includes areas, each area may be provided in various forms such as a closed polygon including linear sides, and a semicircle, a semiellipse or the like including sides formed as a curved line. The surface areas of the areas may be the same as or different from each other. In an embodiment, there will be described an example in which the display area DA is provided as a single area having a rectangular shape including linear sides.

The non-display area NDA may be provided on at least one side of the display area DA. In an embodiment, the non-display area NDA may enclose the display area DA.

The pixels PXL may be provided in the display area DA of the substrate SUB. Each of the pixels PXL may include at least one light emitting element LD that is electrically connected with a scan line and a data line and configured to be driven in response to a corresponding scan signal and a corresponding data signal.

Each pixel PXL may emit light having a color among red, green, and blue, but the disclosure is not limited thereto. For example, each of the pixels PXL may emit light having a color among cyan, magenta, yellow, and white.

In detail, the pixels PXL may include a first pixel PXL1 configured to emit light having a first color, a second pixel PXL2 configured to emit light having a second color different from the first color, and a third pixel PXL3 configured to emit light having a third color different from the first color or the second color. At least one first pixel PXL1, at least one second pixel PXL2, and at least one third pixel PXL3 that are disposed adjacent to each other may form a pixel part PXU which may emit light having various colors.

In an embodiment, the first pixel PXL1 may be a red pixel which emits red light, a second pixel PXL2 may be a green pixel which emits green light, and a third pixel PXL3 may be a blue pixel which emits blue light.

In an embodiment, the respective pixels PXL may be provided with light emitting elements LD configured to emit light having the same color, and include different color conversion layers disposed on the respective light emitting elements LD so that different colors of light can be emitted. In an embodiment, the respective pixels PXL may include light emitting elements LD configured to emit different colors of light. However, the colors, the types, and/or the numbers of respective pixels PXL are not particularly limited.

The pixels PXL may be arranged in a first direction DR1 and a second direction DR2 intersecting the first direction DR1. However, the arrangement of the pixels PXL is not particularly limited, and the pixels PXL may be arranged in various forms.

The drivers may provide signals to the pixels PXL through the respective lines (not illustrated) and thus control the operation of the pixels PXL. The lines are omitted from FIG. 2 for the convenience sake of explanation.

The drivers may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller (not illustrated). The timing controller may control the scan driver SDV, the emission driver EDV, and the data driver DDV. In an embodiment, the display device 1000 may not include the emission driver EDV.

The scan driver SDV and the emission driver EDV may be disposed on a side of the substrate SUB and disposed in a direction (e.g., the second direction DR2). The scan driver SDV and the emission driver EDV may be mounted on the substrate SUB as a separate component, but the disclosure is not limited thereto. For example, the scan driver SDV and the emission driver EDV may be directly formed on the substrate SUB. Furthermore, the scan driver SDV and the emission driver EDV may be located outside the substrate SUB and electrically connected to the respective pixels PXL by separate connectors. The scan driver SDV and the emission driver EDV may be disposed on a same side of the substrate SUB, but the disclosure is not limited thereto, and they may be disposed on different sides.

The data driver DDV may be disposed on a side of the substrate SUB, and be disposed in a direction (e.g., in the first direction DR1) intersecting that of the scan driver SDV and the emission driver EDV. Furthermore, the data driver DDV may be mounted on the substrate SUB as a separate component, or may be located outside the substrate SUB, and may also be electrically connected to the respective pixels PXL by separate connectors.

In an embodiment, each of the pixels PXL may be formed as an active pixel. However, the types, structures, and/or driving methods of the pixels PXL applicable to the disclosure are not particularly limited.

Figure 3A:
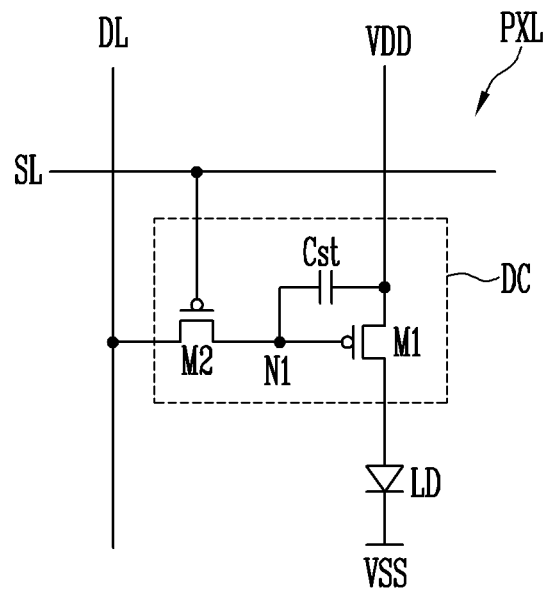
FIGS. 3A to 3C are schematic diagram equivale circuits each illustrating a pixel in accordance with an embodiment.
Figure 3B:
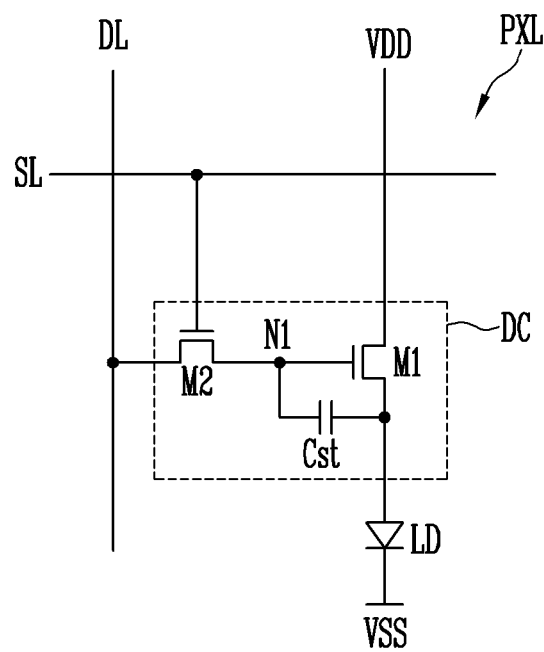
Figure 3C:
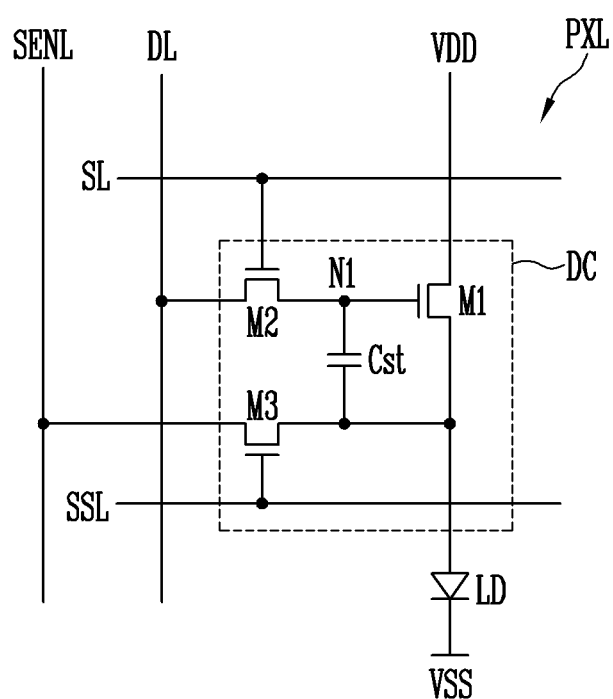

FIGS. 3A to 3C are schematic diagrams of equivalent circuits each illustrating a pixel in accordance with an embodiment. Particularly, FIGS. 3A to 3C illustrate examples of a pixel that forms an active emission display panel.

Referring to FIGS. 1A to 3A, the pixel PXL may include at least one light emitting element LD, and a pixel driving circuit (or driving circuit) DC which is electrically connected to the light emitting element LD and configured to drive the light emitting element LD.

A first electrode (e.g., an anode electrode) of the light emitting element LD may be electrically connected to a first driving power supply VDD via the pixel driving circuit DC. A second electrode (e.g., a cathode electrode) of the light emitting element LD may be electrically connected to a second driving power supply VSS. The light emitting element LD may emit light at a luminance corresponding to the amount of a driving current which is controlled by the pixel driving circuit DC.

Although FIG. 3A illustrates only a light emitting element LD, this illustrates only an example. Actually, the pixel PXL may include light emitting elements LD. The light emitting elements LD may be electrically connected in parallel and/or series to each other.

The first driving power supply VDD and the second driving power supply VSS may have different potentials. For example, the second driving power supply VSS may have a potential lower than that of the first driving power supply VDD by a value equal to or greater than a threshold voltage of the light emitting element LD. In other words, a voltage to be applied to the first driving power supply VDD may be greater than a voltage to be applied to the second driving power supply VSS.

In an embodiment, the pixel driving circuit DC may include a first transistor M1, a second transistor M2, and a storage capacitor Cst.

A first electrode of the first transistor (driving transistor) M1 may be electrically connected to the first driving power supply VDD, and a second electrode thereof may be electrically connected to a first electrode (e.g., an anode electrode) of the light emitting element LD. A gate electrode of the first transistor M1 may be electrically connected to a first node N1. The first transistor M1 may control the amount of a driving current to be supplied to the light emitting elements LD in response to a voltage of the first node N1.

A first electrode of the second transistor (switching transistor) M2 may be electrically connected to a data line DL, and a second electrode thereof may be electrically connected to the first node N1. Here, the first electrode and the second electrode of the second transistor M2 may be different electrodes. For example, if the first electrode is a source electrode, the second electrode is a drain electrode. A gate electrode of the second transistor M2 may be electrically connected to a scan line SL.

In case that a scan signal having a voltage (e.g., a gate-on voltage) capable of turning on the second transistor M2 is supplied from the scan line SL, the second transistor M2 is turned on to electrically connect the data line DL with the first node N1. Here, a data signal of a corresponding frame is supplied to the data line DL, whereby the data signal may be transmitted to the first node N1. The data signal transmitted to the first node N1 may be stored in the storage capacitor Cst.

A first electrode of the storage capacitor Cst may be electrically connected to the first driving power supply VDD, and a second electrode thereof may be electrically connected to the first node N1. The storage capacitor Cst may be charged with a voltage corresponding to a data signal supplied to the first node N1, and maintain the charged voltage until a data signal of a subsequent frame is supplied.

For the convenience sake of explanation, FIG. 3A illustrates the pixel driving circuit DC having a relatively simple structure, including the second transistor M2 configured to transmit a data signal to the interior of each of the pixels PXL, the storage capacitor Cst configured to store the data signal, and the first transistor M1 configured to supply driving current corresponding to the data signal to the light emitting element LD.

However, the disclosure is not limited thereto, and the structure of the driving circuit DC may be changed in various ways. For example, the pixel driving circuit DC may further include various kinds of transistors such as a compensation transistor configured to compensate for the threshold voltage of the first transistor M1, an initialization transistor configured to initialize the first node N1, and/or an emission control transistor configured to control an emission time of the light emitting element LD, or other circuit elements such as a boosting capacitor configured to boost the voltage of the first node N1.

Furthermore, although FIG. 3A illustrates that the transistors, e.g., the first and second transistors M1 and M2, included in the pixel driving circuit DC are formed as P-type transistors, the disclosure is not limited thereto. In other words, at least one of the first and second transistors M1 and M2 included in the pixel driving circuit DC may be changed to an N-type transistor.

For example, as illustrated in FIG. 3B, each of the first and second transistors M1 and M2 of the pixel driving circuit DC may be formed as an N-type transistor. The configuration and operation of the pixel driving circuit DC illustrated in FIG. 3B are different from those of the pixel driving circuit DC of FIG. 3A in a change in connection positions of some components due to a change in the type of transistor. Therefore, detailed descriptions thereof will be omitted.

Referring to FIG. 3C, the pixel PXL may further include a third transistor (sensing transistor) M3.

A gate electrode of the third transistor M3 may be electrically connected to a sensing signal line SSL. A first electrode of the third transistor M3 may be electrically connected to a sensing line SENL, and a second electrode thereof may be electrically connected to the anode electrode of the light emitting element LD. The third transistor M3 may transmit a voltage value of the anode electrode of the light emitting element LD to the sensing line SENL in response to a sensing signal supplied to the sensing signal line SSL during a sensing period. The voltage value transmitted through the sensing line SENL may be provided to an external circuit (e.g., a timing controller). The external circuit may extract information about characteristics of the pixels PXL (e.g., a threshold voltage of the first transistor M1, etc.) based on the provided voltage value. The extracted characteristic information may be used to convert image data to compensate for a deviation in characteristics of the pixel PXL.

Figure 4:
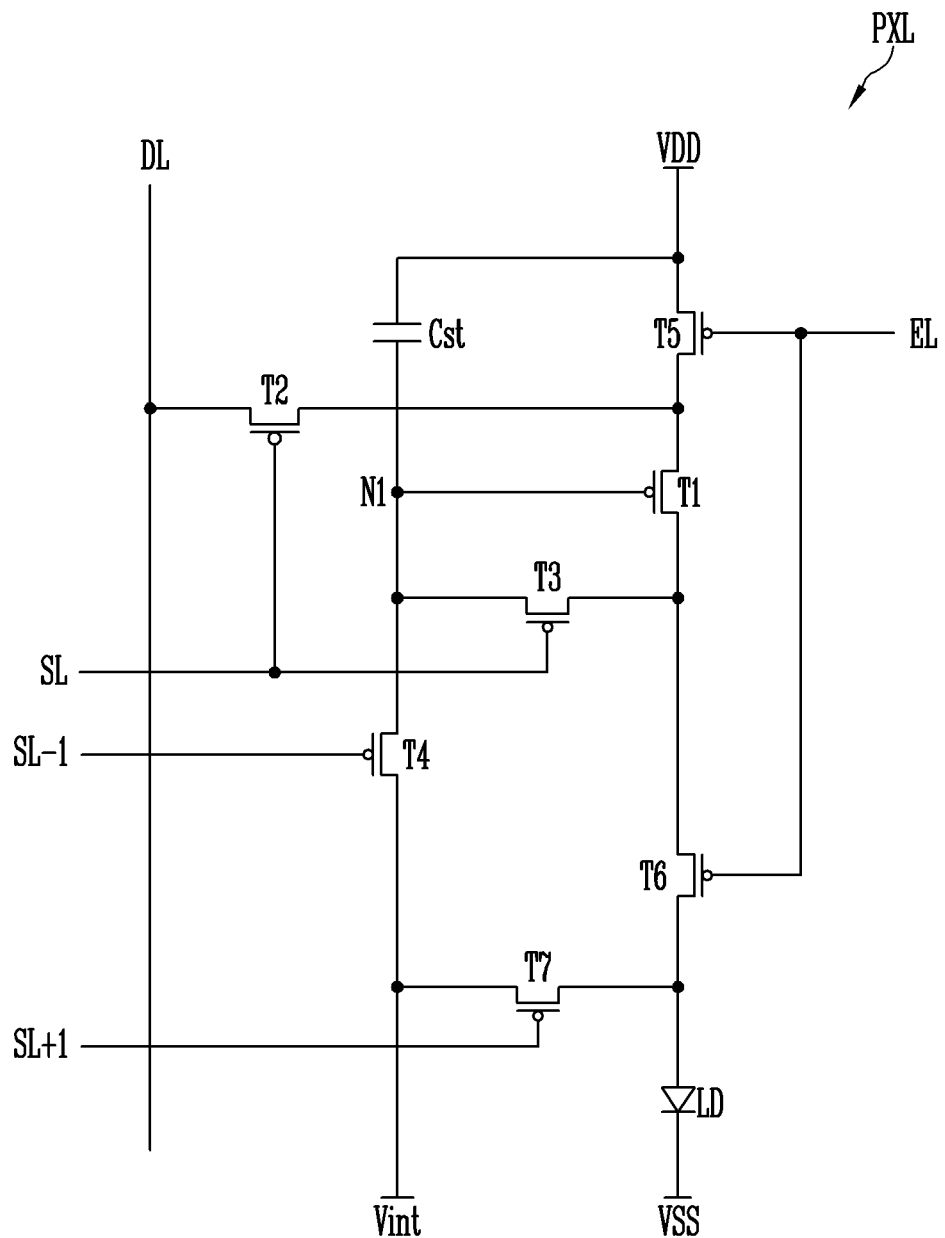
FIG. 4 is a schematic diagram of an equivalent circuit illustrating a pixel in accordance with an embodiment.

FIG. 4 is a schematic diagram of an equivalent circuit illustrating a pixel in accordance with an embodiment.

Referring to FIG. 4, a pixel PXL in accordance with an embodiment may include a light emitting device LD, first to seventh transistors T1, T2, T3, T4, T5, T6, and T7, and a storage capacitor Cst.

A first electrode (e.g., an anode electrode) of the light emitting element LD may be electrically connected to the first transistor T1 via the sixth transistor T6. A second electrode (e.g., a cathode electrode) of the light emitting element LD may be electrically connected to a second driving power supply VSS. The light emitting element LD may emit light having a luminance corresponding to the amount of a driving current supplied from the first transistor T1.

A first electrode of the first transistor (driving transistor) T1 may be electrically connected to the first driving power supply VDD via the fifth transistor T5, and a second electrode thereof may be electrically connected to a first electrode of the light emitting device LD via the sixth transistor T6. The first transistor T1 may control the amount of a current flowing from the first driving power supply VDD to the second driving power supply VSS via the light emitting element LD, in response to the voltage of the first node N1, which is a gate electrode thereof.

The second transistor (switching transistor) T2 may be electrically connected between a data line DL and the first electrode of the first transistor T1. A gate electrode of the second transistor T2 may be electrically connected to a first scan line SL. In case that a scan signal having a gate-on voltage is supplied to the first scan line SL, the second transistor T2 may be turned on so that the data line DL may be electrically connected with the first electrode of the first transistor T1.

The third transistor T3 may be electrically connected between the second electrode of the first transistor T1 and the first node N1. A gate electrode of the third transistor T3 may be electrically connected to the first scan line SL. In case that a scan signal having a gate-on voltage is supplied to the first scan line SL, the third transistor T3 may be turned on so that the second electrode of the first transistor T1 may be electrically connected with the first node N1.

The fourth transistor T4 may be electrically connected between the first node N1 and an initialization power supply Vint. A gate electrode of the fourth transistor T4 may be electrically connected to a second scan line SL−1. In case that a scan signal having a gate-on voltage is supplied to the second scan line SL−1, the fourth transistor T4 is turned on so that the voltage of the initialization power supply Vint may be supplied to the first node N1. Here, the voltage of the initialization power supply Vint may be set to a voltage lower than that of a data signal. A scan signal to be applied to the second scan line SL−1 and a scan signal to be supplied to a first scan line SL of a pixel of a preceding stage may have a same waveform.

The fifth transistor T5 may be electrically connected between the first driving power supply VDD and the first electrode of the first transistor T1. A gate electrode of the fifth transistor T5 may be electrically connected to an emission control line EL. The fifth transistor T5 may be turned on in case that an emission control signal having a gate-on voltage is supplied to the emission control line EL, and may be turned off in other cases.

The sixth transistor T6 is electrically connected between the second electrode of the first transistor T1 and the first electrode of the light emitting element LD. A gate electrode of the sixth transistor T6 may be electrically connected to the emission control line EL. The sixth transistor T6 may be turned on in case that an emission control signal having a gate-on voltage is supplied to the emission control line EL, and may be turned off in other cases.

The seventh transistor T7 may be electrically connected between the initialization power supply Vint and the first electrode (e.g., the anode electrode) of the light emitting element LD. A gate electrode of the seventh transistor T7 may be electrically connected to a third scan line SL+1. In case that a scan signal having a gate-on voltage is supplied to the third scan line SL+1, the seventh transistor T7 may be turned on so that the voltage of the initialization power supply Vint may be supplied to the first electrode of light emitting element LD. A scan signal to be applied to the third scan line SL+1 and a scan signal to be supplied to a first scan line SL of a pixel of a subsequent stage may have a same waveform.

FIG. 4 illustrates the case where a gate electrode of the seventh transistor T7 is electrically connected to the third scan line SL+1. However, the technical idea of the disclosure is not limited thereto. For example, in an embodiment, the gate electrode of the seventh transistor T7 may be electrically connected to the first scan line SL or the second scan line SL−1. In this case, in case that a scan signal having a gate-on voltage is supplied to the first scan line SL or the second scan line SL−1, the voltage of the initialization power supply Vint may be supplied to the anode electrode of the light emitting device LD via the seventh transistor T7.

The storage capacitor Cst may be electrically connected between the first driving power supply VDD and the first node N1. The storage capacitor Cst may store a voltage corresponding both to a data signal and to a threshold voltage of the first transistor T1.

Although FIG. 4 illustrates that the transistors, e.g., the first to seventh transistors T1, T2, T3, T4, T5, T6, and T7, included in the pixel driving circuit DC are formed as P-type transistors, the disclosure is not limited thereto. For example, at least one of the first to seventh transistors T1, T2, T3, T4, T5, T6, and T7 may be changed to an N-type transistor.

Figure 5:
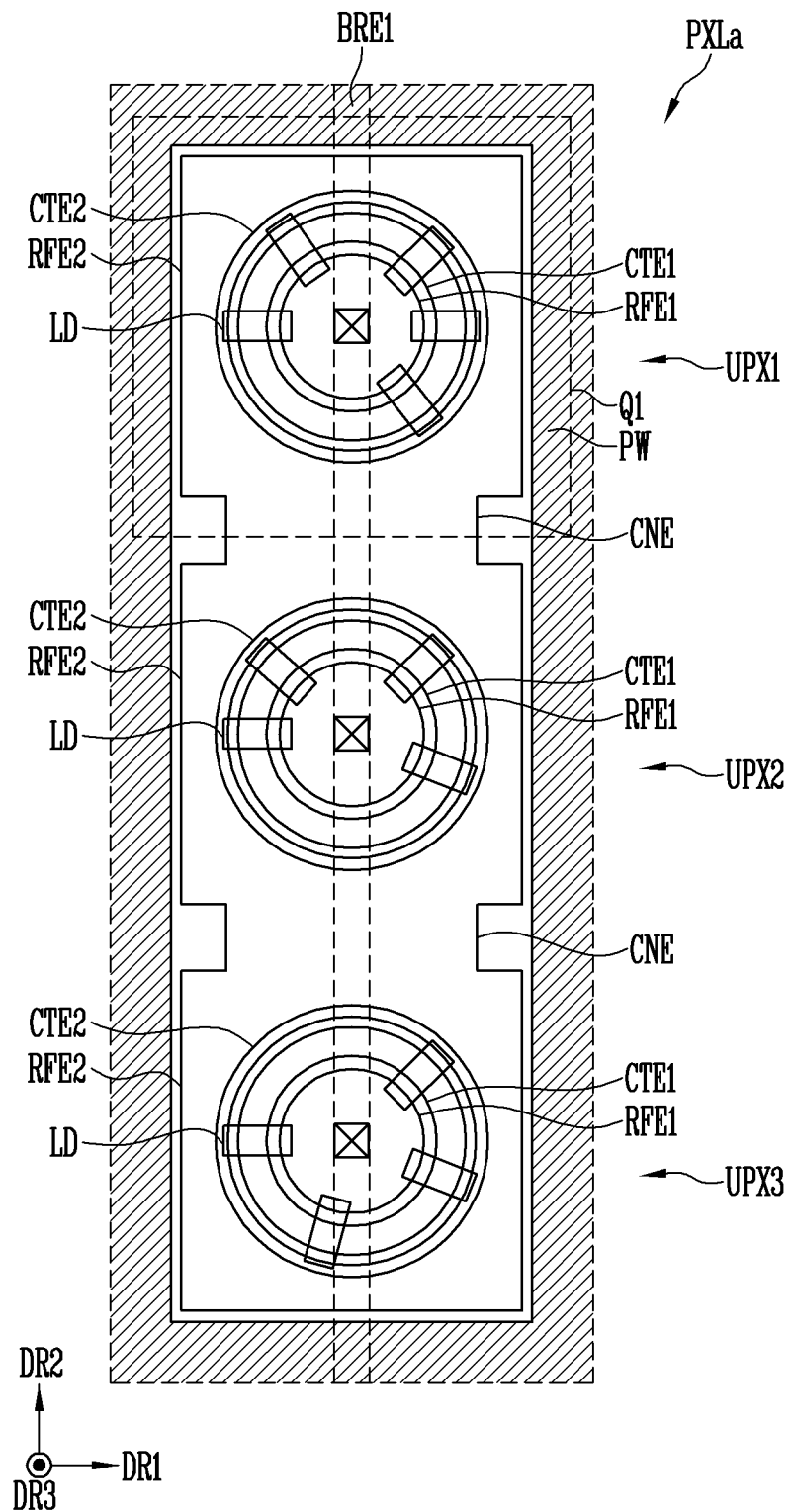
FIG. 5 is a schematic plan view illustrating a pixel in accordance with an embodiment.
Figure 6:
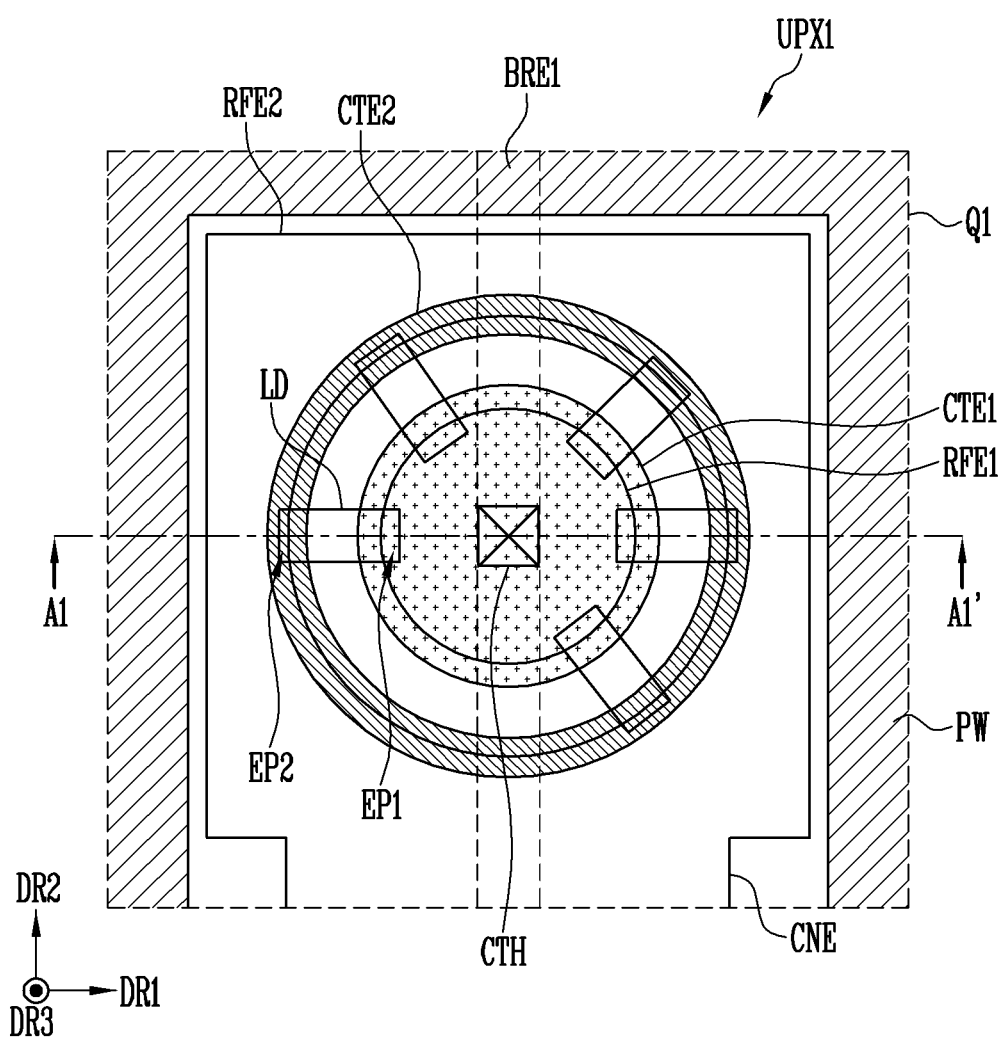
FIG. 6 is a schematic plan view of a pixel in accordance with an embodiment, and is a plan view illustrating an enlargement of area Q1 of FIG. 5.
Figure 7:
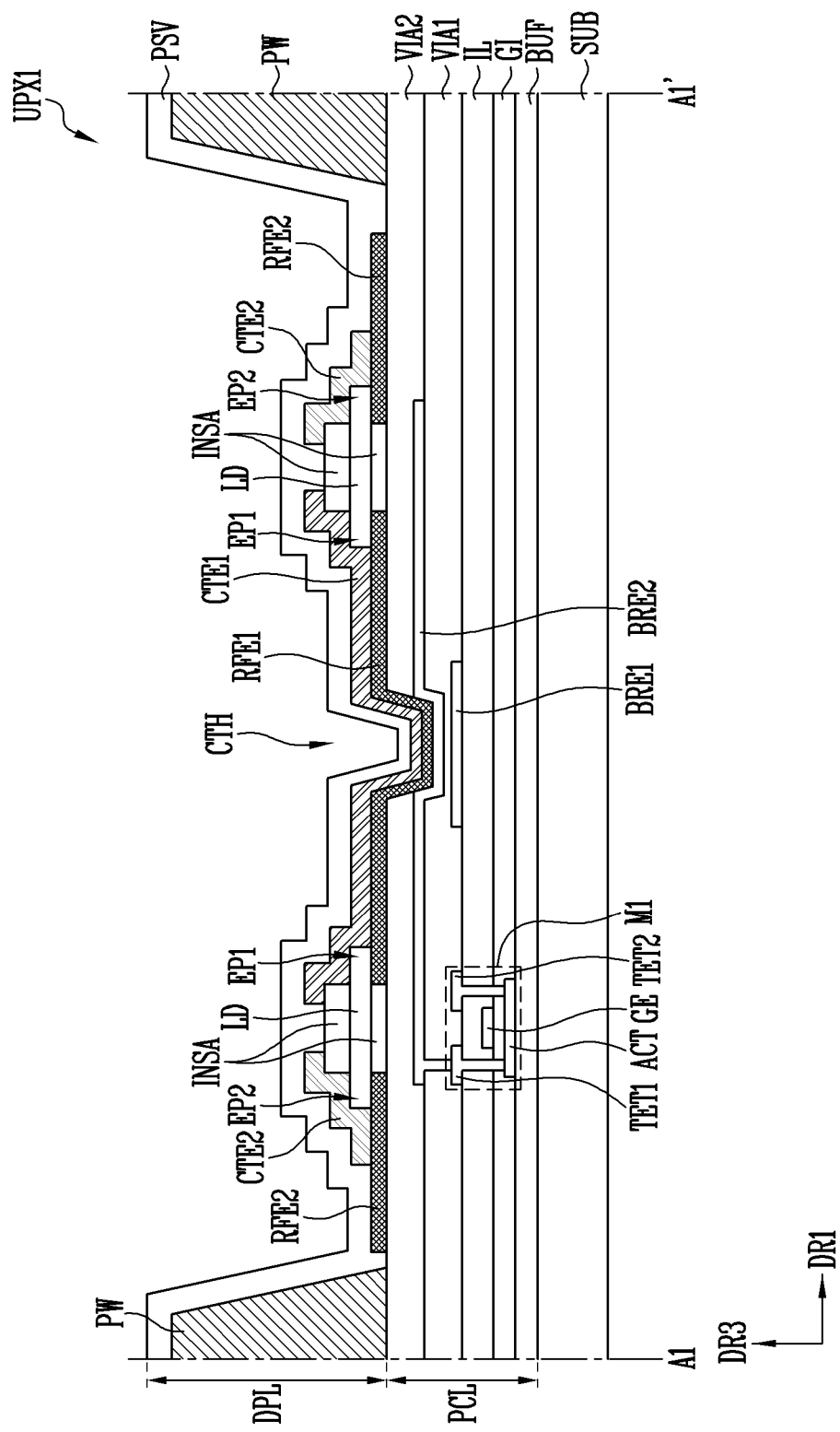
FIGS. 7 and 8 are schematic cross-sectional views of a pixel in accordance with an embodiment, and are cross-sectional views taken along line A1-A1' of FIG. 6.
Figure 8:
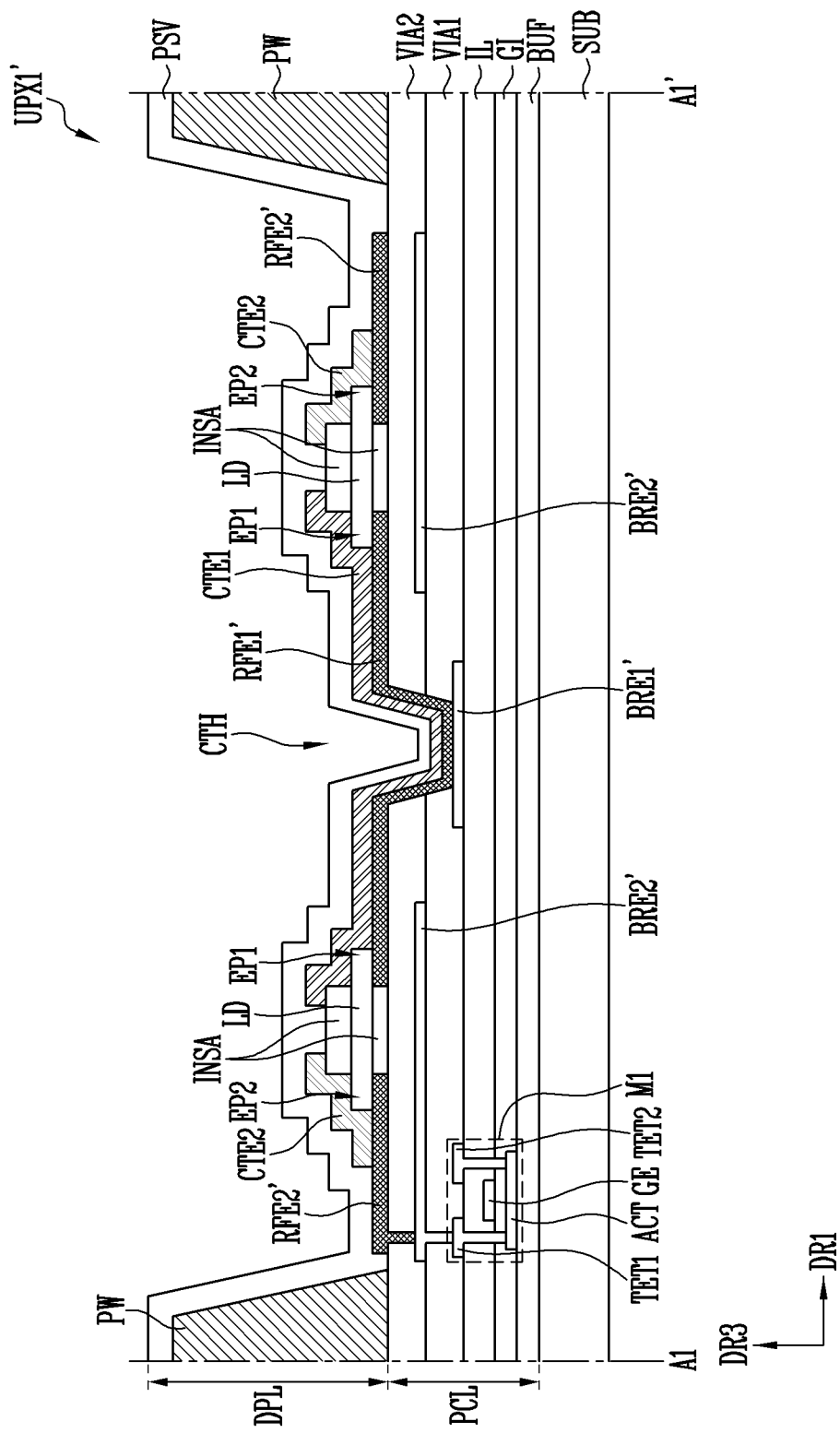

FIG. 5 is a schematic plan view illustrating a pixel in accordance with an embodiment. FIG. 6 is a schematic plan view of a pixel or unit pixel (hereinafter "unit pixel") in accordance with an embodiment, and is a schematic plan view illustrating an enlargement of area Q1 of FIG. 5. FIGS. 7 and 8 are schematic cross-sectional views of a unit pixel in accordance with an embodiment, and are cross-sectional views taken along line A1-A1' of FIG. 6.

For the convenience sake of explanation, hereinafter, each electrode will be simplified and illustrated as being formed as a single electrode layer, but the disclosure is not limited thereto. Each electrode may also be formed as electrode layers. In an embodiment, the phrase "components are formed and/or disposed on a same layer" may mean that the components are formed by a same process and formed of a same material.

Furthermore, for the sake of explanation, transistors electrically connected to the light emitting elements, and signal lines electrically connected to the transistors are omitted from FIG. 5.

Referring to FIGS. 5 to 8, the display device in accordance with an embodiment may include a substrate SUB, and a pixel PXLa provided on the substrate SUB.

The substrate SUB may be a rigid substrate or a flexible substrate, and the material or properties thereof are not particularly limited. For example, the substrate SUB may be a rigid substrate made of (or including) glass or reinforced glass, or a flexible substrate formed as a thin film made of plastic or metal. Furthermore, the substrate SUB may be a transparent substrate, but the disclosure is not limited thereto. For instance, the substrate SUB may be a translucent substrate, an opaque substrate, or a reflective substrate.

The pixel PXLa may include unit pixels UPX1, UPX2, and UPX3. For example, the unit pixels UPX1, UPX2, and UPX3 may include a first unit pixel UPX1, a second unit pixel UPX2, and a third unit pixel UPX3.

The first to third unit pixels UPX1, UPX2, and UPX3 may be arranged adjacent to each other, and form a pixel PXLa. Each of the unit pixels UPX1, UPX2, and UPX3 may be a group of smallest components for emitting light, and emit a same color of light. Furthermore, the pixel PXLa may be a smallest unit configured to emit a color of light.

The structures of the unit pixels UPX1, UPX2, and UPX3 included in the pixel PXLa may be equal or similar to each other, and thus hereinafter will be described in detail based on the structure of the first unit pixel UPX1. The description thereof may be equally applied to the second and third unit pixels UPX2 and UPX3.

The first unit pixel UPX1 may include a pixel circuit layer PCL disposed on the substrate SUB, and a display element layer DPL disposed on the pixel circuit layer PCL.

The pixel circuit layer PCL may include circuit elements which form a pixel driving circuit of each of the unit pixels UPX1, UPX2, and UPX3. FIG. 7 illustrates an example of a structure in which the pixel circuit layer PCL includes the first transistor M1 of FIGS. 3A to 3C. However, the structure of the pixel circuit layer PCL is not limited thereto, and may further include other circuit elements of FIGS. 3A, 3B, and 4.

The transistors included in the pixel circuit layer PCL may include a substantially identical or similar cross-sectional structure. Furthermore, the structure of each of the transistors is not limited to the structure illustrated in FIG. 7.

The pixel circuit layer PCL may include layers. For example, the pixel circuit layer PCL may include a buffer layer BUF, a gate insulating layer GI, an interlayer insulating layer IL, a first via layer VIA1, and a second via layer VIA2 which are successively stacked on the substrate SUB. The foregoing layers may be insulating layers each including an organic insulating material or an inorganic insulating material. In addition, the pixel circuit layer PCL may include the first transistor M1.

The buffer layer BUF may prevent impurities from diffusing into each circuit element. The buffer layer BUF may be provided in a single layer structure, and the buffer layer BUF may be provided in a multilayer structure having at least two layers. In case that the buffer layer BUF has a multilayer structure, the respective layers may be formed of an identical material or different materials. The buffer layer BUF may be omitted depending on the material of the substrate SUB or processing conditions.

The first transistor M1 may be disposed on the buffer layer BUF. The first transistor M1 may include an active layer ACT, a gate electrode GE, a first transistor electrode TET1, and a second transistor electrode TET2.

The active layer ACT may be disposed between the buffer layer BUF and the gate insulating layer GI. In case that the pixel circuit layer PCL does not include the buffer layer BUF, the active layer ACT may be disposed between the substrate SUB and the gate insulating layer GI. The active layer ACT may include a first area electrically contacting the first transistor electrode TET1, a second area electrically connected to the second transistor electrode TET2, and a channel area disposed between the first and second areas. One of the first and second areas may be a source area, and the other may be a drain area.

The active layer ACT may be a semiconductor pattern formed of polysilicon, amorphous silicon, an oxide semiconductor, etc. The channel area of the active layer ACT may be an intrinsic semiconductor, which is an undoped semiconductor pattern. Each of the first and second areas of the active layer ACT may be a semiconductor pattern doped with an impurity.

The gate electrode GE may be disposed between the gate insulating layer GI and the interlayer insulating layer IL and overlap at least a portion of the active layer ACT. The gate electrode GE may be insulated from the active layer ACT by the gate insulating layer GI.

The first and second transistor electrodes TET1 and TET2 may be disposed on the interlayer insulating layer IL. The first and second transistor electrodes TET1 and TET2 may be electrically connected to the active layer ACT. For example, the first and second transistor electrodes TET1 and TET2 may respectively contact the first area and the second area of the active layer ACT through contact holes passing through the gate insulating layer GI and the interlayer insulating layer IL.

A first bridge line BRE1, the first transistor electrode TET1, and the second transistor TET2 may be disposed on a same layer. The first bridge line BRE1 may extend in the second direction DR2 in a plan view. Although not illustrated in the drawings, the first bridge line BRE1 may be electrically connected to a second electrode RFE2, which will be described below, through a contact hole or a separate connector. The first bridge line BRE1 may be electrically connected to the second driving power supply VSS (see FIG. 3A) to provide a voltage of the second driving power supply VSS to the second electrode RFE2.

The first transistor electrode TET1 of the first transistor M1 may be electrically connected to a second bridge line BRE2 disposed on the first via layer VIA1, through a contact hole passing through the first via layer VIA1 disposed on the first transistor electrode TET1.

The second bridge line BRE2 may be electrically connected to a first electrode RFE1 through a contact hole CTH passing through the second via layer VIA2 and at least a portion of the first via layer VIA1, and may transmit a driving current, provided through the first transistor M1, to the first electrode RFE1. The second bridge line BRE2 may be widely disposed on the first via layer VIA1 so that at least a portion thereof overlaps the light emitting elements LD of the display element layer DPL. In this case, a voltage drop of the driving voltage provided to the light emitting elements LD may be prevented from occurring, so that the display quality of the display device can be enhanced.

The connection structure of the first bridge line BRE1 and the second bridge line BRE2 is not limited thereto. For example, as illustrated in FIG. 8, in a first unit pixel UPX1', a first bridge line BRE1' may be electrically connected to a first electrode RFE1' through the contact hole CTH so that the voltage of the second driving power supply VSS may be provided to the first electrode RFE1'. Furthermore, a second bridge line BRE2' may be electrically connected to a second electrode RFE2' through a contact hole so that driving current provided form the first transistor M1 may be provided to the second electrode RFE2'.

In the foregoing embodiment, there has been described an example in which the pixel circuit layer PCL included in the pixel PXLa (or the first unit pixel UPX1) is disposed under and overlap the display element layer DPL in a plan view, but the disclosure is not limited thereto. In an embodiment, the pixel circuit layer PCL may be disposed under the display element layer DPL and may also be provided in an area which does not overlap the display element layer DPL.

Hereinbelow, the display element layer DPL will be described. The display element layer DPL may be disposed over the pixel circuit layer PCL (or the second via layer VIA2) and include light emitting elements LD.

In detail, the display element layer DPL may include the first and second electrodes RFE1 and RFE2, the light emitting elements LD, a fixing layer INSA, third and fourth electrodes CTE1 and CTE2, and a passivation layer PSV. In an embodiment, the pixel PXLa may further include a partition wall PW which encloses the respective unit pixels UPX1, UPX2, and UPX3.

The first and second electrodes RFE1 and RFE2 may be disposed at position spaced apart from each other. The second electrode RFE2 may be disposed to enclose at least a portion of the first electrode RFE1.

The first electrode RFE1 (or a first reflective electrode) may be located in a central portion of the first unit pixel UPX1 and formed in a circular shape. The shape of the first electrode RFE1 is not limited to the circular shape, and may be formed to have various shapes each having a looped curved structure.

As described above, the first electrode RFE1 may be electrically connected to the second bridge line BRE2 of the pixel circuit layer PCL through the contact hole CTH, and be supplied with a driving current through the second bridge line BRE2.

The second electrode RFE2 (or a second reflective electrode) may be disposed to enclose the first electrode RFE1 in a plan view. The second electrode RFE2 may be formed in various shapes such as a rectangle, a circle, and an ellipse, in a plan view, and have an opening in which the first electrode RFE1 may be disposed. The shape of the opening included in the second electrode RFE2 may be equal or similar to that of the first electrode RFE1, and the shape of the opening is not limited so long as the first electrode RFE1 and the second electrode RFE2 can be disposed at positions spaced apart from each other. For example, FIG. 6 illustrates a structure in which the first electrode RFE1 of the first unit pixel UPX1 has a circular shape, the second electrode RFE2 has a rectangular shape, and which includes an opening which has a shape corresponding to that of the first electrode RFE1 and is larger than the first electrode RFE1.

The second electrodes RFE2 of the respective unit pixels UPX1, UPX2, and UPX3 may be electrically connected to each other by a connection pattern CNE, but the disclosure is not limited thereto. For example, the second electrode RFE2 may be individually formed in each of the unit pixels UPX1, UPX2, and UPX3 and be electrically connected to lines of the pixel circuit layer PCL.

Although not illustrated in the drawings, the second electrode RFE2 may be electrically connected to the first bridge line BRE1 and supplied with a voltage of the second driving power supply VSS (see FIG. 3A).

One of the first and second electrodes RFE1 and RFE2 may be an anode electrode, and the other electrode may be a cathode electrode. For example, the first electrode RFE1 may be an anode electrode, and the second electrode RFE2 may be a cathode electrode, but the disclosure is not limited thereto.

The first electrode RFE1 and the second electrode RFE2 may be formed of a conductive material(s). The conductive material may include metal, for example, Ag, Mg, Al, Pt, Pd, Au, Ni, Nd, Ir, Cr, Ti, and an alloy thereof, but the disclosure is not limited thereto.

Each of the first electrode RFE1 and the second electrode RFE2 may be formed as a single layer, but the disclosure is not limited thereto, and it may also be formed as multiple layers. For example, the first electrode RFE1 and the second electrode RFE2 each may further include a capping layer (not illustrated) formed of a transparent conductive material (s). The capping layer may be disposed to cover the first electrode RFE1 and the second electrode RFE2 so that the first electrode RFE1 and the second electrode RFE2 may be prevented from being damaged during a process of manufacturing the display device.

The material of the first electrode RFE1 and the second electrode RFE2 is not limited to the above-mentioned materials. For example, the first electrode RFE1 and the second electrode RFE2 may be made of a conductive material having a constant reflectivity. In case that the first electrode RFE1 and the second electrode RFE2 are made of a conductive material having a constant reflectivity, light emitted from the light emitting elements LD may be reflected by the first electrode RFE1 and the second electrode RFE2 and travel in a display direction (e.g., a third direction DR3).

A distance (or spacing distance) between the first electrode RFE1 and the second electrode RFE2 may be substantially uniform. Therefore, the light emitting elements LD to be aligned between the first and second electrodes RFE1 and RFE2 may be more uniformly aligned.

The light emitting elements LD may be disposed on the first electrode RFE1 and the second electrode RFE2. The light emitting elements LD may be radially disposed around the first electrode RFE1. Distances between the light emitting elements LD may differ from each other, but the disclosure is not limited thereto. The light emitting elements LD may be disposed to have a same distance therebetween.

The light emitting elements LD disposed on the first electrode RFE1 and the second electrode RFE2 may form a parallel connection structure, but the disclosure is not limited thereto.

Each of the light emitting elements LD may include a first end EP1 and a second end EP2. The first end EP1 may overlap the first electrode RFE1. The second end EP2 may overlap the second electrode RFE2. Referring also to FIG. 1A, the second semiconductor layer 13 may be disposed on the first end EP1, and the first semiconductor layer 11 may be disposed on the second end EP2.

The light emitting element LD may be supplied with a driving current (or driving signals) from the first electrode RFE1 and the second electrode RFE2, and emit light having a luminance corresponding to the provided driving current.

The fixing layer INSA may be disposed on the light emitting elements LD to stably support and fix the light emitting elements LD. The fixing layer INSA may be formed as an inorganic insulating layer including an inorganic material, or an organic insulating layer including an organic material. The fixing layer INSA may be disposed such that a space between the light emitting elements LD and the second via layer VIA2 is filled with the fixing layer INSA. The fixing layer INSA may cover at least a portion of an outer circumferential surface of each of the light emitting elements LD and be formed such that the first end EP1 and the second end EP2 of the light emitting element LD are exposed. Hence, the fixing layer INSA may stably support and fix the light emitting elements LD so that the light emitting elements LD may be prevented from being removed from the display element layer DPL. The fixing layer INSA may be omitted depending on processing conditions of the display element layer DPL.

The third and fourth electrodes CTE1 and CTE2 may be disposed on the first electrode RFE1, the second electrode RFE2, and the light emitting elements LD.

The third electrode CTE1 (or a first contact electrode) may be formed in a circular shape in a plan view, and disposed to cover the first electrode RFE1 and overlap the first electrode RFE1. The first end EP1 of the light emitting element LD may be disposed between the first electrode RFE1 and the third electrode CTE1. The third electrode CTE1 may contact the first electrode RFE1 and the first end EP1 of the light emitting element LD. In other words, the first electrode RFE1 may be electrically connected to the first end EP1 of the light emitting element LD by the third electrode CTE1.

The fourth electrode CTE2 (or a second contact electrode) may be formed in a ring shape in a plan view, and disposed to overlap the second electrode RFE2. The second end EP2 of the light emitting element LD may be disposed between the second electrode RFE2 and the fourth electrode CTE2. The fourth electrode CTE2 may contact the second electrode RFE2 and the second end EP2 of the light emitting element LD. In other words, the second electrode RFE2 may be electrically connected to the second end EP2 of the light emitting element LD by the fourth electrode CTE2.

However, the shapes of the third electrode CTE1 and the fourth electrode CTE2 are not limited to those illustrated in the drawings, and may be changed in various ways. Furthermore, the third electrode CTE1 and the fourth electrode CTE2 may be formed on a same layer, but the disclosure is not limited thereto, and they may be formed on different layers.

Each of the third and fourth electrodes CTE1 and CTE2 may be formed of a transparent conductive material. For example, the transparent conductive material may include indium tin oxide (ITO), indium zinc oxide (IZO), and indium tin zinc oxide (ITZO). In case that the third and fourth electrodes CTE1 and CTE2 are formed of transparent conductive materials, loss of light that is emitted from the light emitting element LD and travels in the third direction DR3 may be reduced. The materials of the third and fourth electrodes CTE1 and CTE2 are not limited to the above-mentioned materials.

The passivation layer PSV may be disposed on the third and fourth electrodes CTE1 and CTE2. The passivation layer PSV may be formed at the outermost portion of the display element layer DPL and cover the other components of the display element layer DPL. The passivation layer PSV may also function as an encapsulation layer for preventing the first to fourth electrodes RFE1, RFE2, CTE1, and CTE2 and the light emitting elements LD from being damaged during a process of fabricating the display device, and preventing oxygen and/or water from permeating into the display element layer DPL.

The passivation layer PSV may be formed as an inorganic insulating layer including an inorganic material. The passivation layer PSV may be formed as a single layer, but the disclosure is not limited thereto, and it may include a multilayer structure. In case that the passivation layer PSV has a multilayer structure, the passivation layer PSV may further include an organic insulating layer including an organic material, and have a structure formed by alternately disposing organic insulating layers and inorganic insulating layers.

Although not illustrated in the drawings, in some embodiments, a planarization layer (not illustrated) may be further provided on the passivation layer PSV. The planarization layer may mitigate a step difference (e.g., height difference) caused by various components disposed thereunder. The planarization layer may include an organic insulating layer, but the disclosure is not limited thereto, and it may also include an inorganic insulating layer.

The pixel PXLa may further include a partition wall PW disposed around the unit pixels UPX1, UPX2, and UPX3. The partition wall PW may be disposed to enclose the unit pixels UPX1, UPX2, and UPX3. The partition wall PW may be disposed on the pixel circuit layer PCL, but the disclosure is not limited thereto. The partition wall PW may be a pixel definition layer configured to define an emission area of the pixel PXLa.

The partition wall PW may include at least one light shielding material and/or reflective material to thus prevent light from leaking between adjacent pixels. Furthermore, the partition wall PW may prevent a solution including light emitting elements LD from leaking into an adjacent pixel during a process of aligning the light emitting elements LD. The partition wall PW may be omitted depending on processing conditions of the display device.

According to the foregoing embodiment, the pixel PXLa of the display device may include the unit pixels UPX1, UPX2, and UPX3, and each of the unit pixels UPX1, UPX2, and UPX3 may include the first electrode RFE1 and the second electrode RFE2 disposed to enclose the first electrode RFE1. The light emitting elements LD disposed between the first electrode RFE1 and the second electrode RFE2 may be radially disposed (or aligned) around the first electrode RFE1. In this case, the light emitting elements LD of each of the unit pixels UPX1, UPX2, and UPX3 may be disposed (or aligned) not to be biased in a specific direction. Therefore, light emitted from each of the light emitting elements LD may be prevented from being concentrated in a specific direction. Hence, the quantity (or intensity) of light emitted from the pixel PXLa may be substantially equal or similar to the quantity (or intensity) of light emitted from an adjacent pixel. Therefore, the display device in accordance with an embodiment may have uniform emission distribution over the overall area thereof.

Figure 9:
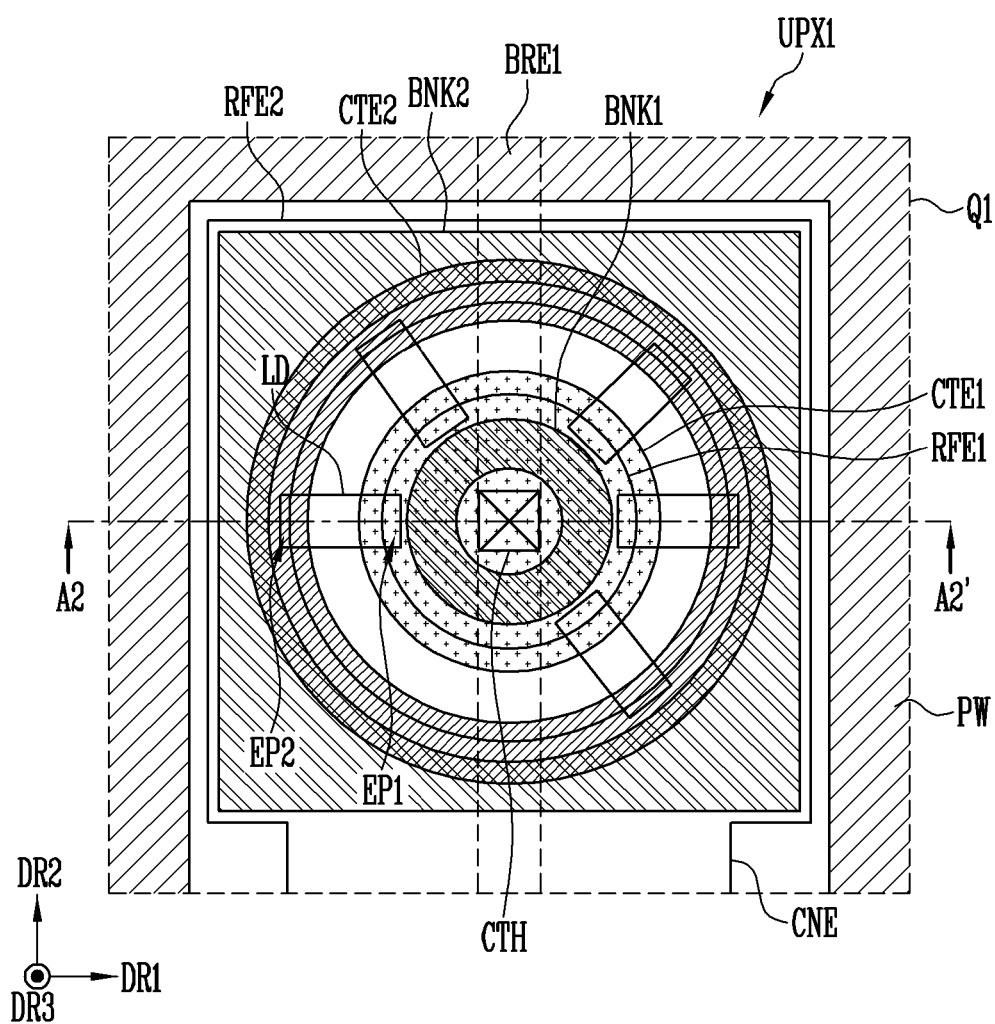
FIG. 9 is a schematic plan view of a pixel in accordance with an embodiment.

FIG. 9 is a schematic plan view of a unit pixel in accordance with an embodiment. FIGS. 10 to 13 are schematic cross-sectional views of unit pixels in accordance with various embodiments, and are schematic cross-sectional views taken along line A2-A2' of FIG. 9.

The embodiments illustrated in FIGS. 9 to 13 differ from the above-described embodiments of FIGS. 5 to 8 in that the display element layer DPL further includes a first bank BNK1 and a second bank BNK2, and the other components thereof are substantially identical or similar to those of the embodiments of FIGS. 5 to 8. Detailed description of components (e.g., the pixel circuit layer PCL) identical or similar to those of the embodiments of FIGS. 5 to 8 will be omitted.

Figure 10:
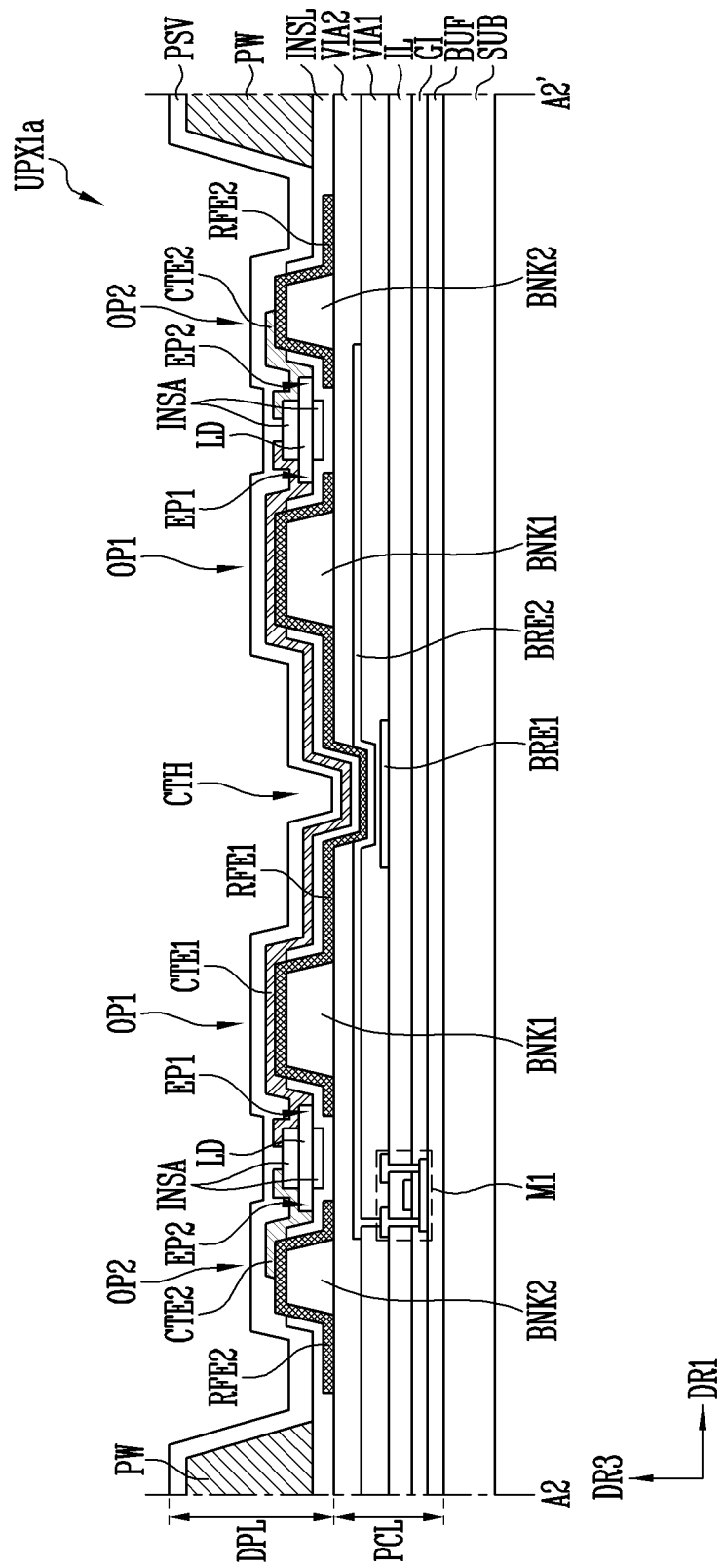
FIGS. 10 to 13 are schematic cross-sectional views of pixels in accordance with various embodiments, and are cross-sectional views taken along line A2-A2' of FIG. 9.

Referring to FIGS. 9 to 10, a display element layer DPL of a first unit pixel UPX1a may include a first bank BNK1, a second bank BNK2, a first electrode RFE1, a second electrode RFE2, an insulating layer INSL, light emitting elements LD, a fixing layer INSA, a third electrode CTE1, and a fourth electrode CTE2, and a passivation layer PSV. Furthermore, the partition wall PW may be formed around the first unit pixel UPX1a.

The first bank BNK1 and the second bank BNK2 may be provided on the pixel circuit layer PCL. Space in which the light emitting elements LD are disposed may be provided between the first bank BNK1 and the second bank BNK2. In an embodiment, the first bank BNK1 and the second bank BNK2 may be spaced apart from each other on the substrate SUB by a distance equal to or greater than a length of the light emitting element LD. The first bank BNK1 and the second bank BNK2 may be disposed on a same layer and have a same height, but the disclosure is not limited thereto.

The first bank BNK1 may overlap the first electrode RFE1 and have a ring shape in a plan view. The first bank BNK1 may not overlap the contact hole CTH, but the disclosure is not limited thereto.

The second bank BNK2 may be disposed to enclose the first bank BNK1. The second bank BNK2 and the second electrode RFE2 may have a substantially identical shape. For example, the second bank BNK2 may be formed in a rectangular shape in a plan view, and have a shape in which an opening is formed. The shape of the second bank BNK2 is not limited thereto, and the second bank BNK2 may be formed in a ring shape enclosing the first bank BNK1.

The first bank BNK1 and the second bank BNK2 may include an organic insulating layer formed of an organic material or an inorganic insulating layer formed of an inorganic material, but the materials of the first bank BNK1 and the second bank BNK2 are not limited thereto. Furthermore, the first bank BNK1 and the second bank BNK2 each may be formed as a single layer, but the disclosure is not limited thereto, and it may be formed as multiple layers. In this case, the first bank BNK1 and the second bank BNK2 each may have a structure formed by stacking at least one organic insulating layer and at least one inorganic insulating layer.

The first bank BNK1 and the second bank BNK2 may have a trapezoidal shape in which sidewalls thereof are inclined at an angle, but the shapes of the first bank BNK1 and the second bank BNK2 are not limited thereto, and may have various shapes such as a semielliptical shape, a circular shape, and a rectangular shape.

The first electrode RFE1 and the second electrode RFE2 may be provided on the first bank BNK1 and the second bank BNK2. In an embodiment, the first electrode RFE1 may be provided on the first bank BNK1. The second electrode RFE2 may be provided on the second bank BNK2. In other words, the first electrode RFE1 and the second electrode RFE2 may be disposed on a same plane and have a same height. If the first electrode RFE1 and the second electrode RFE2 have a same height, the light emitting element LD may be more reliably electrically connected to each of the first electrode RFE1 and the second electrode RFE2.

The first electrode RFE1 and the second electrode RFE2 may be disposed along surfaces of the first bank BNK1 and the second bank BNK2 to have a substantially uniform thickness. The first electrode RFE1 and the second electrode RFE2 may have shapes corresponding to those of the first bank BNK1 and the second bank BNK2. For example, the first electrode RFE1 may have a shape with an inclination corresponding to that of the first bank BNK1, and the second electrode RFE2 may have a shape with an inclination corresponding to that of the second bank BNK2.

As described above, the first electrode RFE1 and the second electrode RFE2 may include conductive materials having a constant reflectivity. In case that the first electrode RFE1 and the second electrode RFE2 have shapes corresponding to those of the first bank BNK1 and the second bank BNK2, the first electrode RFE1 and the second electrode RFE2 may also have an angle as in the first bank BNK1 and the second bank BNK2. Light emitted from the opposite ends of each of the light emitting elements LD may be reflected by the first electrode RFE1 and the second electrode RFE2 and thus more reliably travel in the third direction DR3. Hence, the light output efficiency of the display device may be improved.

An insulating layer INSL may be provided on the first electrode RFE1 and the second electrode RFE2. The insulating layer INSL may be provided on an overall surface of the pixel circuit layer PCL, and cover the first and second banks BNK1 and BNK2 and the first and second electrodes RFE1 and RFE2. Furthermore, the insulating layer INSL may be disposed along the surface of the pixel circuit layer PCL (or the substrate SUB) on which the first and second banks BNK1 and BNK2 and the first and second electrodes RFE1 and RFE2 have not been disposed.

In an embodiment, the insulating layer INSL may include an inorganic insulating layer formed of an inorganic material. In this case, the insulating layer INSL may be disposed to have a uniform thickness along the surfaces of the pixel circuit layer PCL and the first and second electrodes RFE1 and RFE2. At least some space may be formed between the insulating layer INSL and the light emitting elements LD disposed on the insulating layer INSL.

The insulating layer INSL may include a first opening OP1 and a second opening OP2. The first opening OP1 and the second opening OP2 may expose at least respective portions of the first electrode RFE1 and the second electrode RFE2.

The first and second openings OP1 and OP2 may be formed to respectively overlap the corresponding first and second electrodes RFE1 and RFE2. For example, the first opening OP1 may be formed to overlap the first electrode RFE1. The second opening OP2 may be formed to overlap the second electrode RFE2.

The first opening OP1 and the second opening OP2 each may have a thickness and/or depth corresponding to a thickness of the insulating layer INSL. In other words, the first opening OP1 and the second opening OP2 each may completely pass through the insulating layer INSL in a corresponding area. Hence, the first and second electrodes RFE1 and RFE2 may be exposed to the outside and thus contact the third and fourth electrodes CTE1 and CTE2.

The light emitting elements LD may be disposed on the insulating layer INSL. The light emitting elements LD may be stably disposed in space defined by the first bank BNK1 and the second bank BNK2. The light emitting elements LD may be electrically connected to the first electrode RFE1 and the second electrode RFE2 by the third electrode CTE1 and the fourth electrode CTE2.

Figure 11:
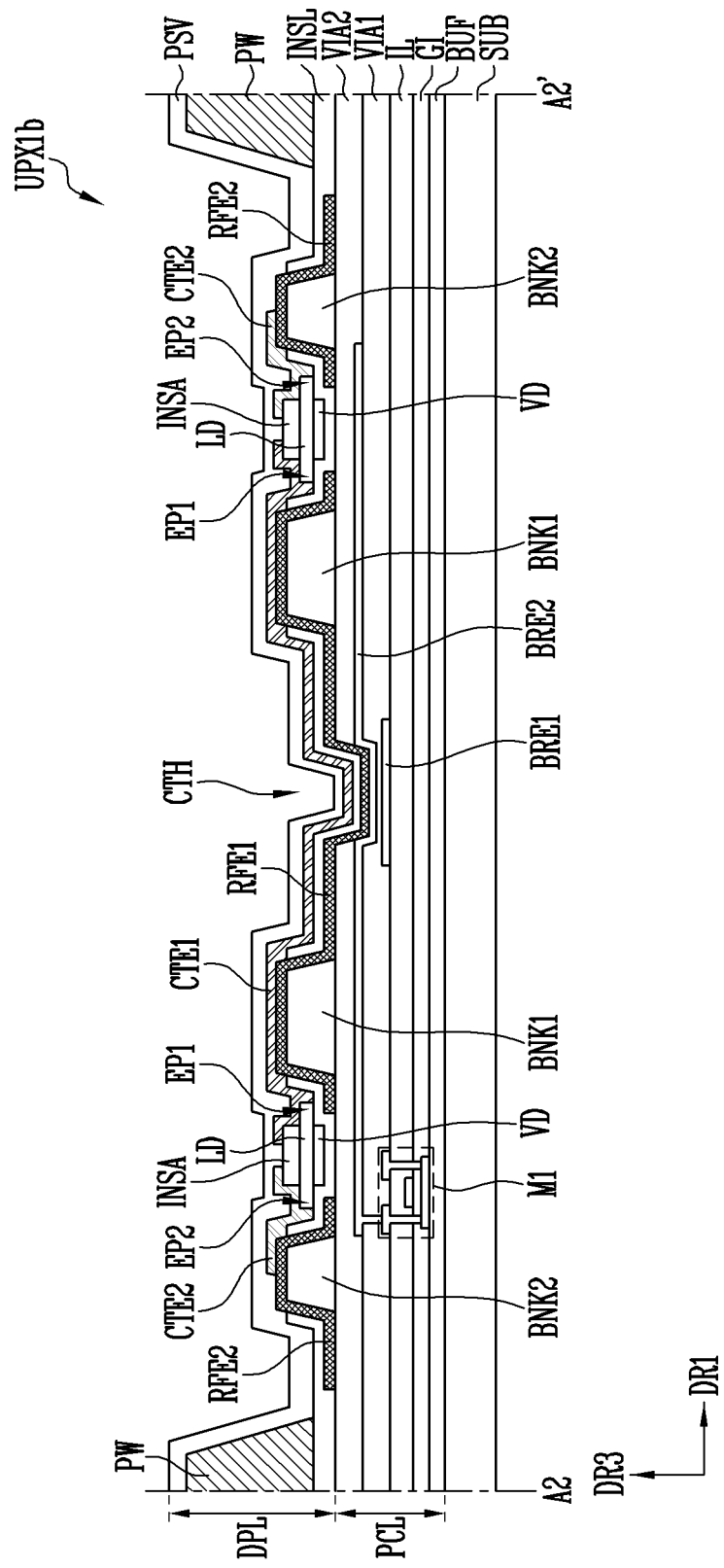

The fixing layer INSA may be disposed on each light emitting element LD. As described above, the fixing layer INSA may cover at least a portion of an outer circumferential surface of each of the light emitting elements LD and be formed such that the first end EP1 and the second end EP2 of the light emitting element LD are exposed. In case that the fixing layer INSA includes an organic insulating layer formed of an organic material, the space between the light emitting element LD and the insulating layer INSL may be filled with the fixing layer INSA, and the fixing layer INSA may support the light emitting element LD, as illustrated in FIG. 10. On the other hand, in case that the fixing layer INSA includes an inorganic insulating layer formed of an inorganic material, a void VD may be at least partially formed between the light emitting element LD and the insulating layer INSL, as illustrated in FIG. 11 illustrating a first unit pixel UPX1b. Although the void VD is formed of an air layer, the disclosure is not limited thereto.

Figure 12:
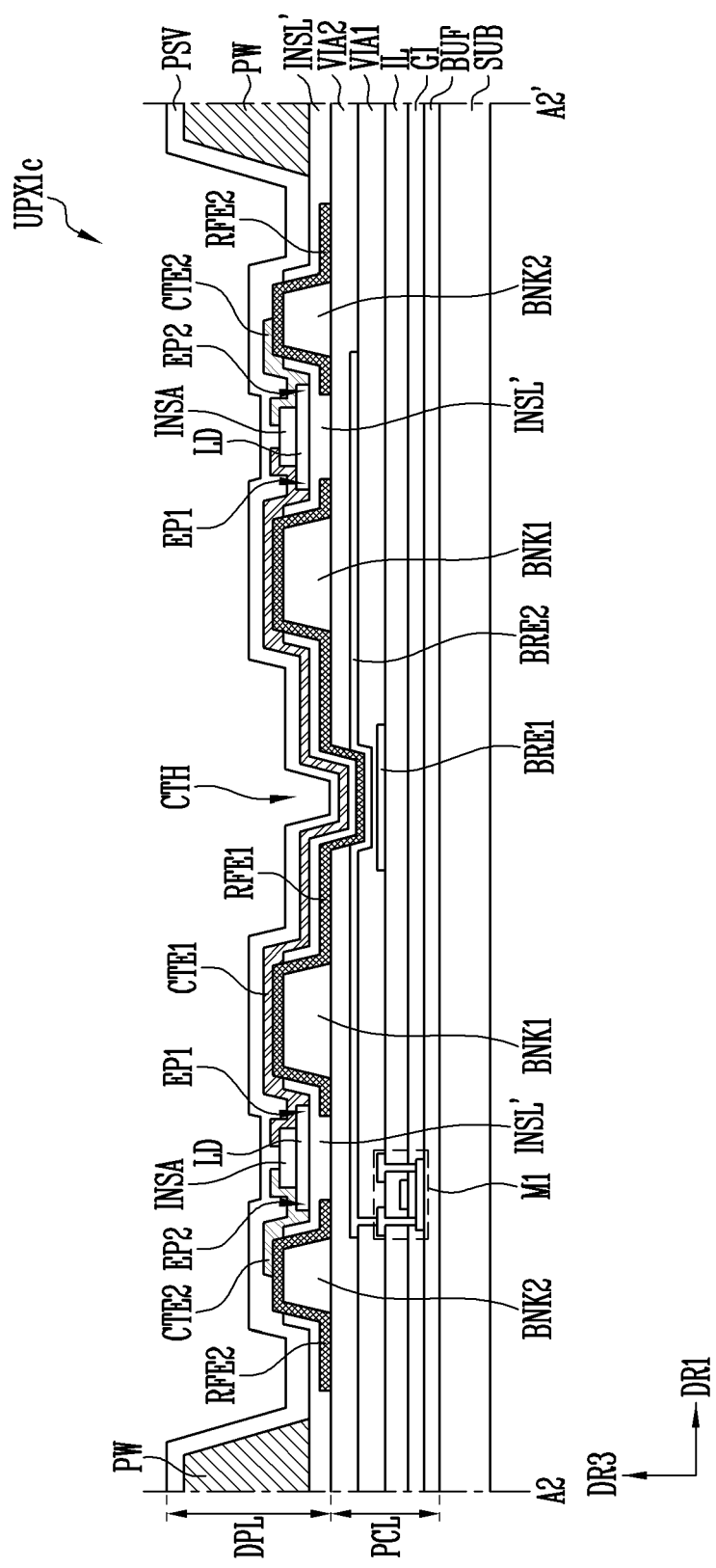

As illustrated in FIG. 12 illustrating a first unit pixel UPX1c, in case that an insulating layer INSL' is evenly formed in an area where the light emitting element LD is disposed, another material or component may not be formed between the light emitting element LD and the insulating layer INSL', and the light emitting element LD may be directly disposed on the insulating layer INSL'.

Referring again to FIG. 10, the third electrode CTE1 and the fourth electrode CTE2 may be formed on the light emitting elements LD and the insulating layer INSL. The third electrode CTE1 may contact the first end EP1 of the light emitting element LD and contact the first electrode RFE1 through the first opening OP1. Furthermore, the fourth electrode CTE2 may contact the second end EP2 of the light emitting element LD and contact the second electrode RFE2 through the second opening OP2.

As described above, the third electrode CTE1 and the fourth electrode CTE2 may be disposed on a same layer, but in another embodiment, the third electrode CTE1 and the fourth electrode CTE2 may be disposed on different layers.

Figure 13:
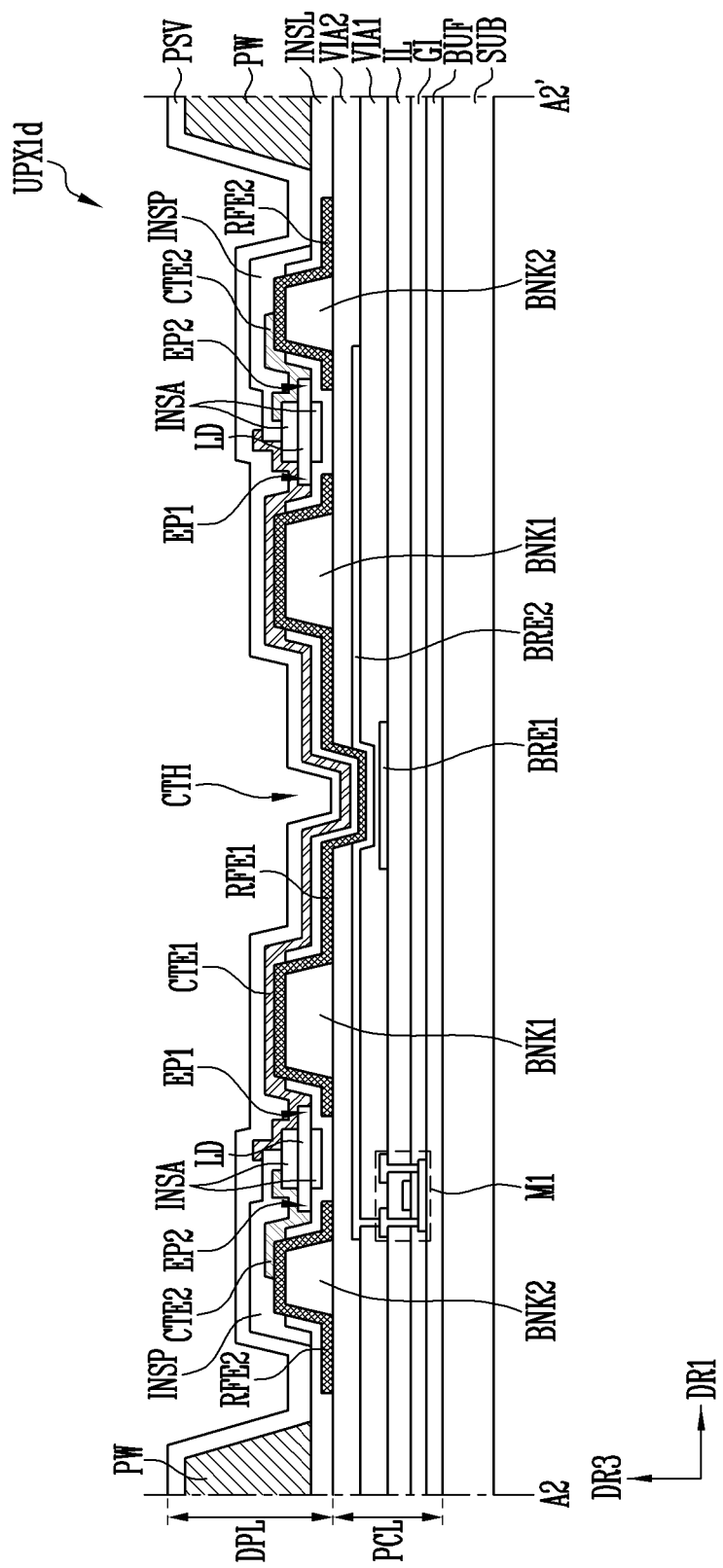

For example, as illustrated in FIG. 13 illustrating a first unit pixel UPX1d, an insulating pattern INSP may be disposed between the third electrode CTE1 and the fourth electrode CTE2.

The insulating pattern INSP may include an inorganic insulating layer formed of an inorganic material. The insulating pattern INSP may be disposed to cover one of the third electrode CTE1 and the fourth electrode CTE2, and the other electrode may be disposed on the insulating pattern INSP. For example, the insulating pattern INSP may be disposed on the fourth electrode CTE2 and cover the fourth electrode CTE2. The third electrode CTE1 may be disposed on the insulating pattern INSP. In other words, the third electrode CTE1 and the fourth electrode CTE2 may be electrically separated from each other by the insulating pattern INSP.

As described above, in case that the unit pixel includes the first bank BNK1 and the second bank BNK2, the light emitting elements LD are stably disposed in space formed between the first bank BNK1 and the second bank BNK2, so that the reliability of the display device and the yield of the manufacturing process thereof can be enhanced. In addition, light emitted from the light emitting elements LD may be effectively emitted to the outside by the inclined sidewalls of the first bank BNK1 and the second bank BNK2, whereby the display quality and the display luminance of the display device may be enhanced.

Figure 14:
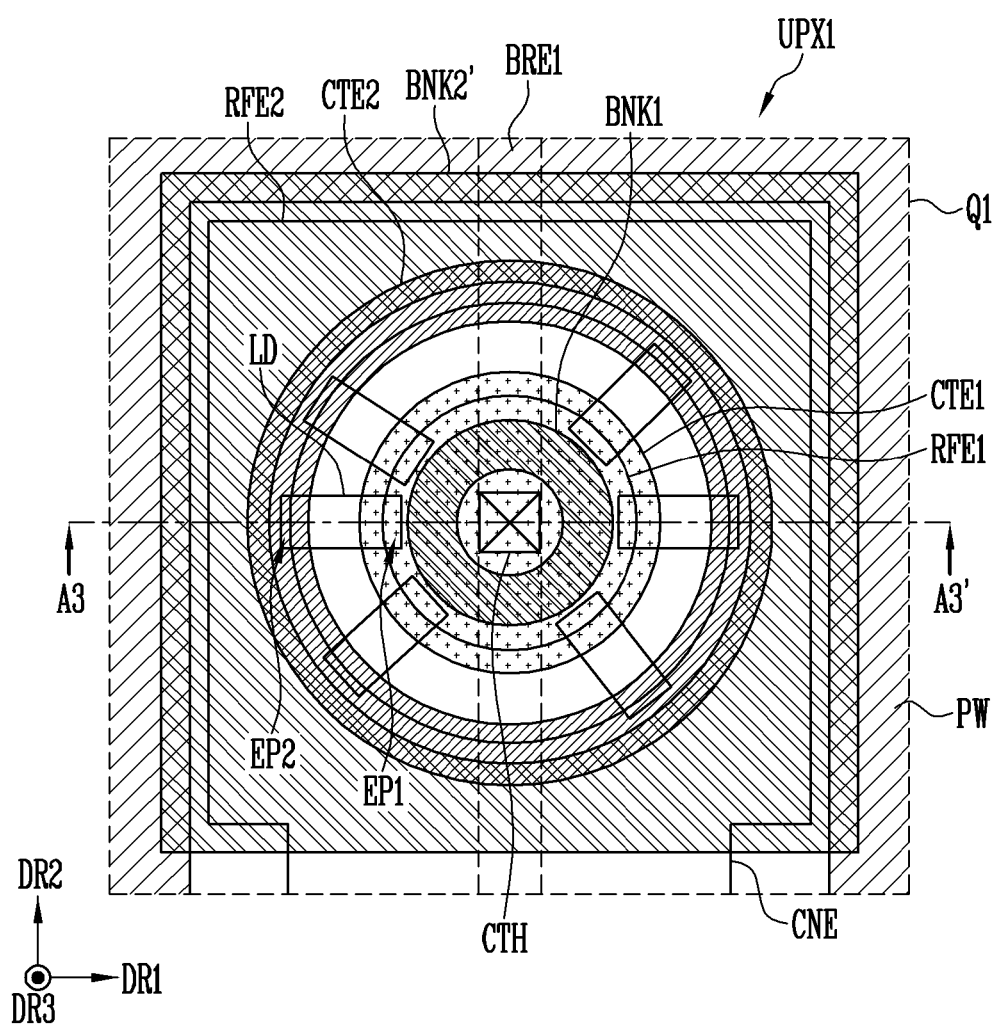
FIG. 14 is a schematic plan view of a pixel in accordance with an embodiment.
Figure 15:
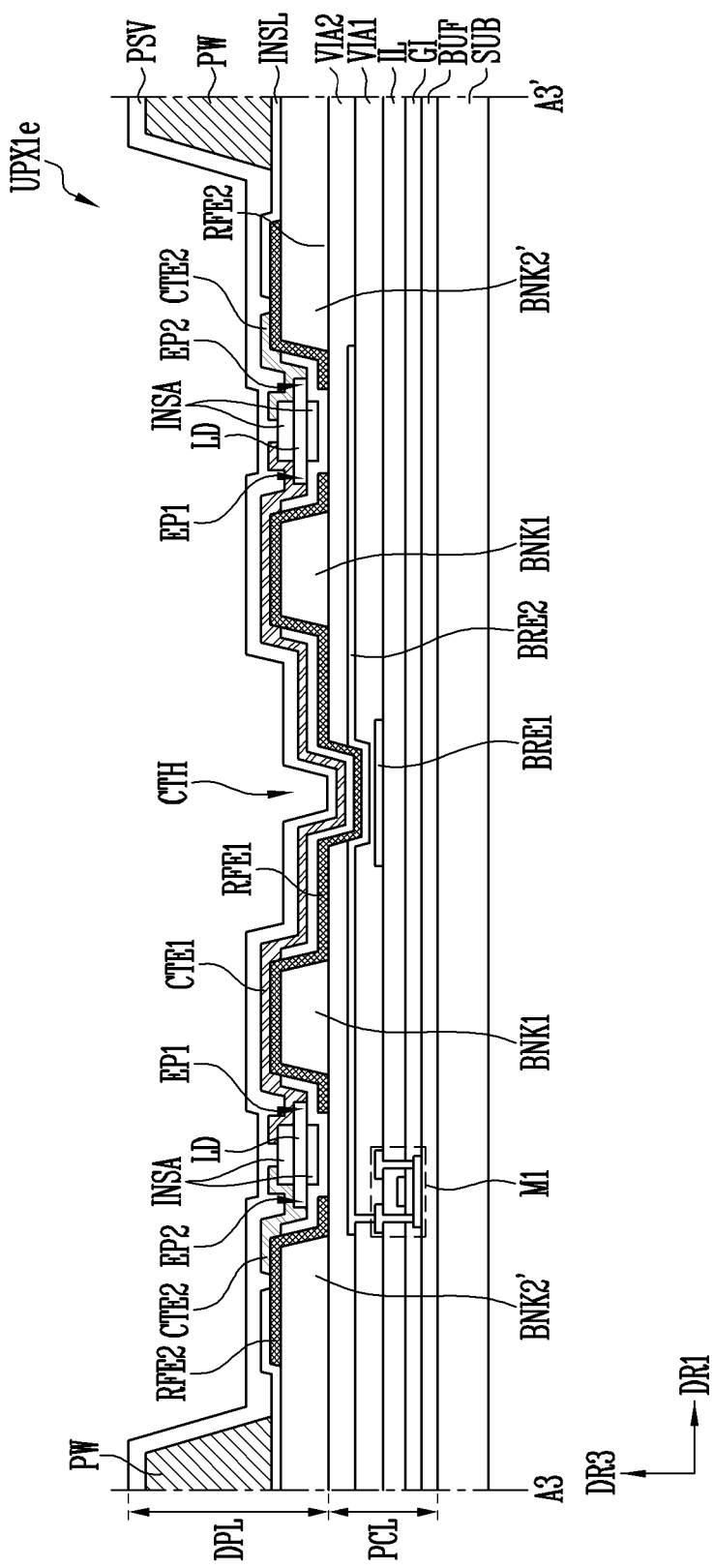
FIG. 15 is a schematic cross-sectional view of a pixel in accordance with an embodiment, and is a cross-sectional view taken along line A3-A3' of FIG. 14.

FIG. 14 is a schematic plan view of a unit pixel in accordance with an embodiment. FIG. 15 is a schematic cross-sectional view of a unit pixel in accordance with an embodiment, and is a schematic cross-sectional view taken along line A3-A3' of FIG. 14.

The embodiment of FIGS. 14 and 15 differs from the embodiment of FIGS. 9 and 10 described above in that a second bank BNK2' further extends outward and partially overlaps the partition wall PW, and the other components thereof are substantially identical or similar to those of the embodiment of FIGS. 9 and 10. Hereinafter, description will be made, focusing on differences from the foregoing embodiments.

Referring to FIGS. 14 and 15, a first unit pixel UPX1e may include a second bank BNK2' which further extends outward in a plan view. Here, the term "outward" may refer to a direction from the first bank BNK1 toward the second bank BNK2'. Hence, at least a portion of the second bank BNK2' may overlap the partition wall PW disposed in a perimeter portion of the first unit pixel UPX1e.

In case that space is formed between the second bank BNK2' and the partition wall PW, during a process of disposing (or aligning) the light emitting elements LD, a light emitting element LD may be disposed between the second bank BNK2' and the partition wall PW rather than being between the first bank BNK1 and the second bank BNK2'. The light emitting element LD that is disposed between the second bank BNK2' and the partition wall PW cannot emit light because driving current cannot be normally supplied thereto. In case that such a light emitting element LD is present, the display luminance of the display device may be reduced.

As shown in the embodiment, in case that the second bank BNK2' further extends outward, the space between the second bank BNK2' and the partition wall PW is removed, so that a defect in which a light emitting element LD is disposed at an undesired position may be prevented from occurring. Therefore, since the number of light emitting elements LD disposed between the first bank BNK1 and the second bank BNK2' may be increased, the display quality and luminance of the display device may be enhanced.

Hereinafter, other embodiments of the pixel and a display device including the same will be described. In the following embodiments, like reference numerals are used to designate components equal or similar to those of the above-mentioned embodiments, and descriptions thereof will be omitted or simplified, and differences therefrom will be mainly described.

Figure 16:
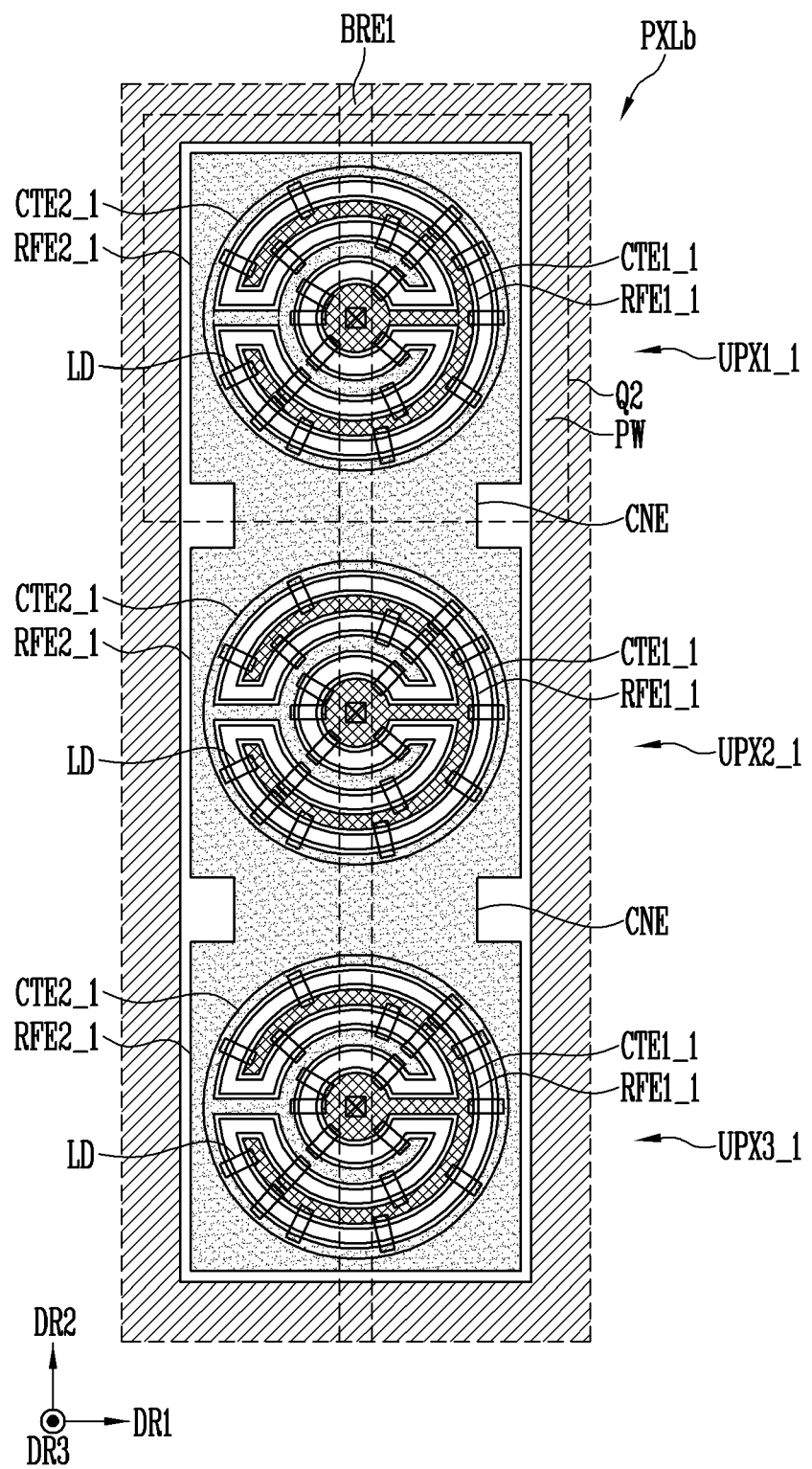
FIG. 16 is a schematic plan view of a pixel in accordance with an embodiment.
Figure 17:
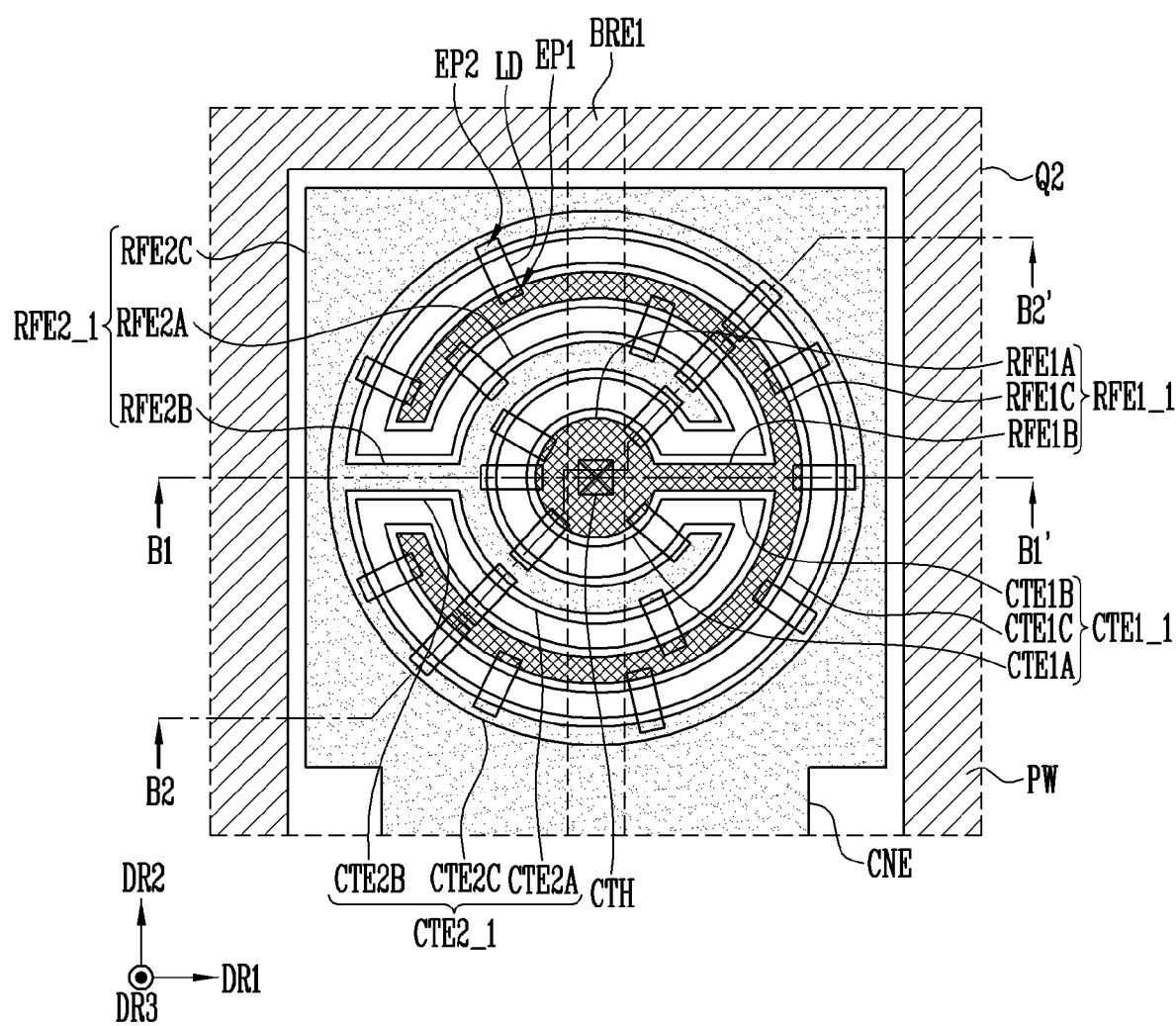
FIG. 17 is a schematic plan view of a pixel in accordance with an embodiment, and is a plan view showing an enlargement of area Q2 of FIG. 16.
Figure 18:
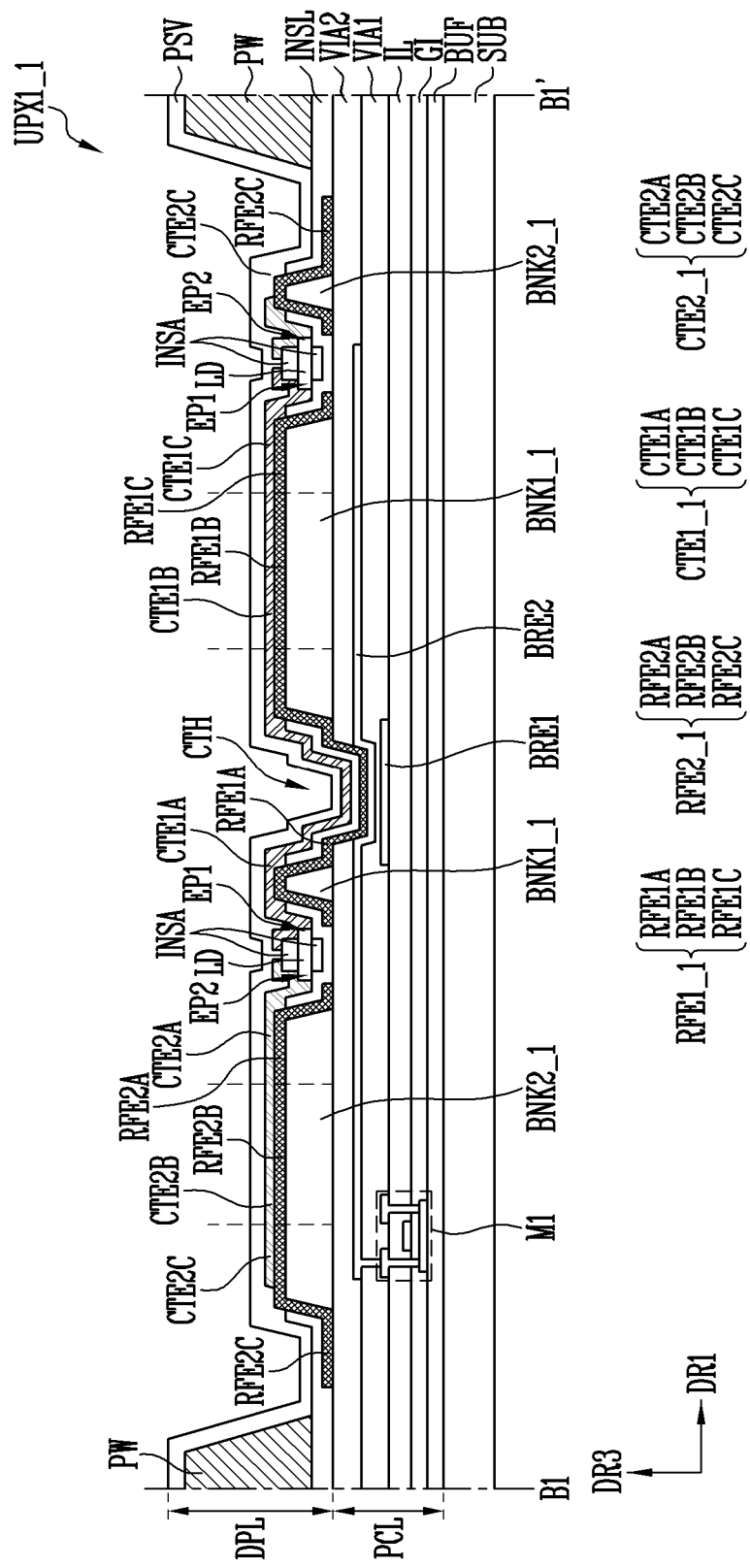
FIG. 18 is a schematic cross-sectional view taken along line B1-B1' of FIG. 17.
Figure 19:
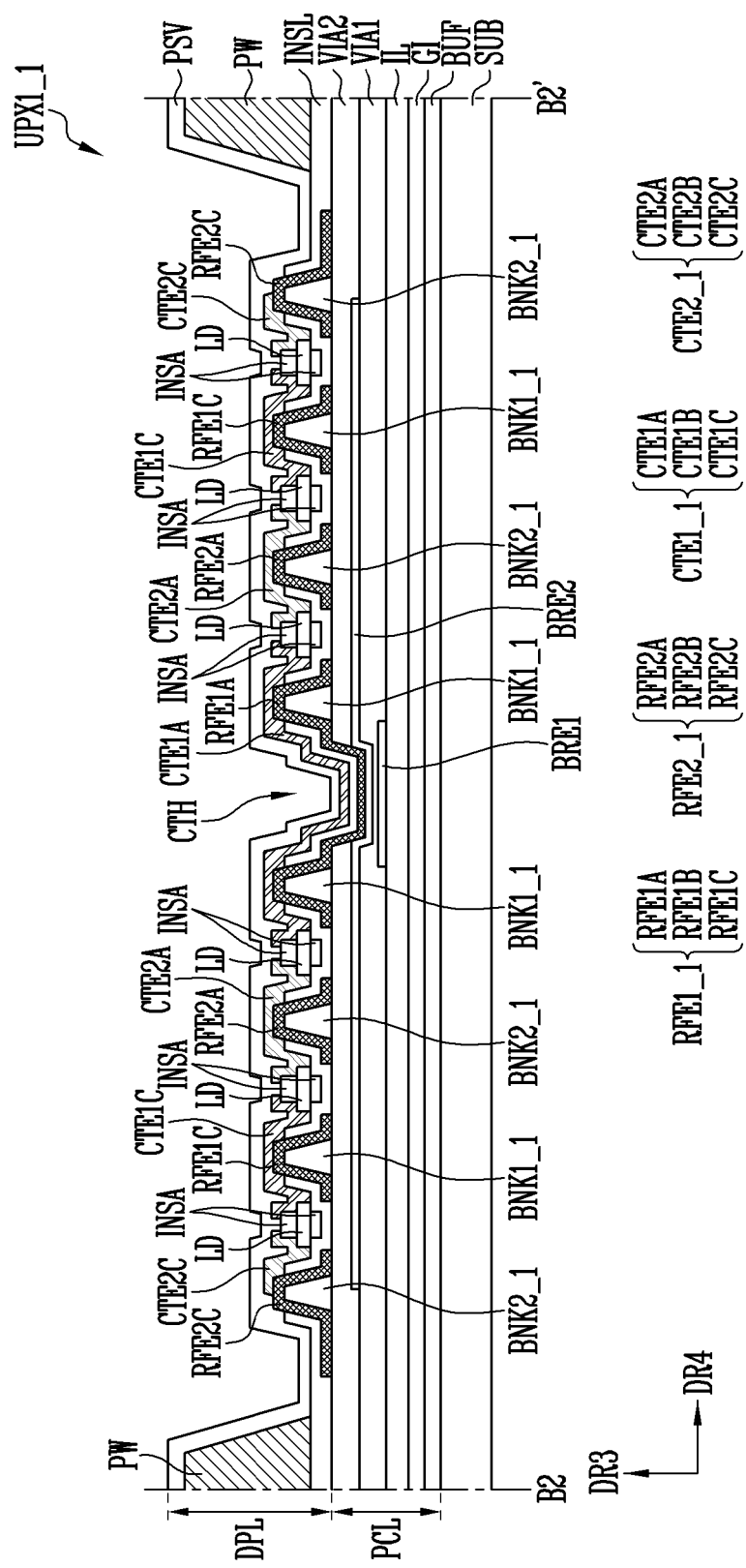
FIG. 19 is a schematic cross-sectional view taken along line B2-B2' of FIG. 17.
Figure 20:
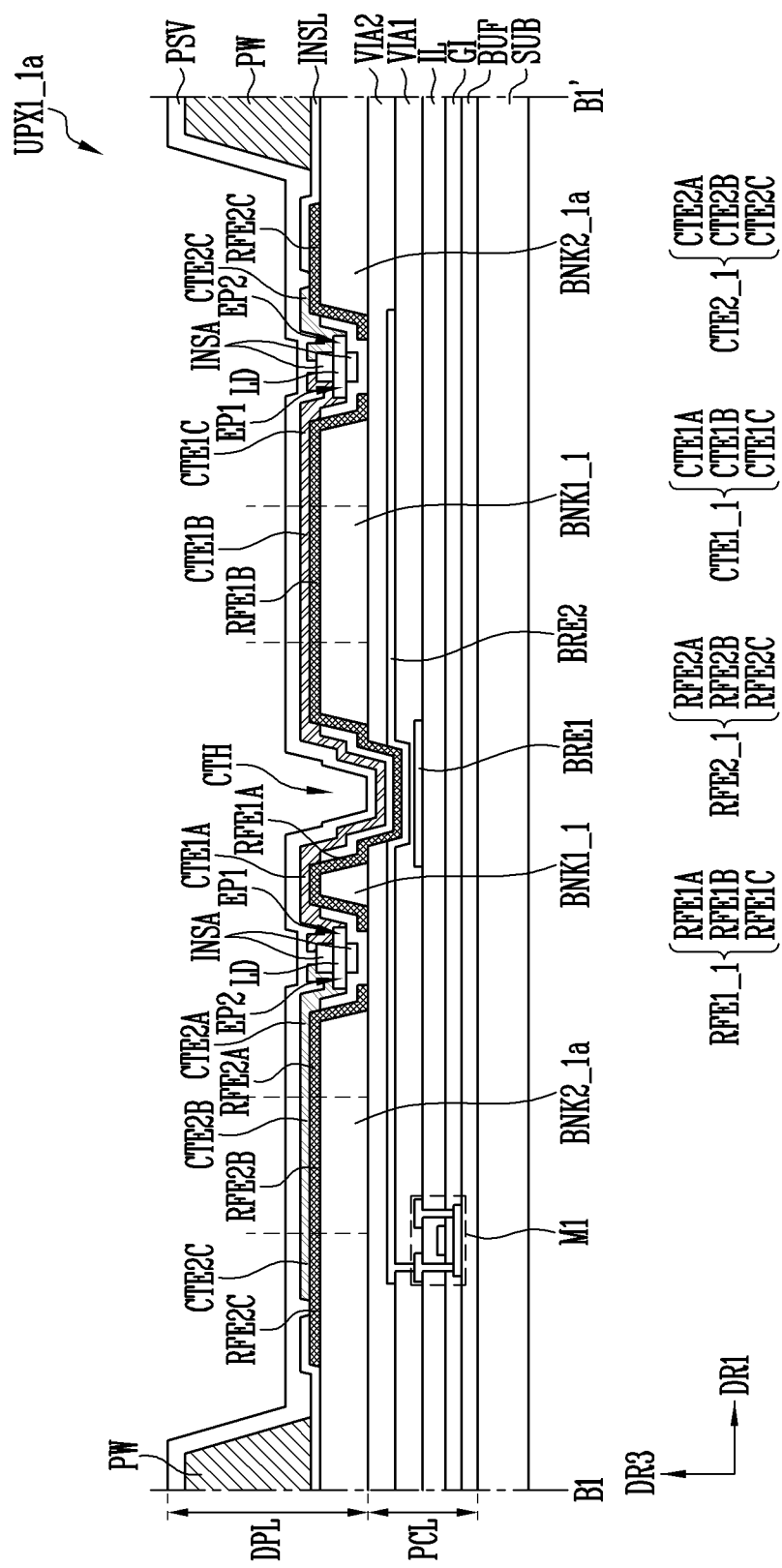
FIG. 20 is a schematic cross-sectional view of a pixel in accordance with an embodiment, and is a cross-sectional view corresponding to line B1-B1' of FIG. 17.

FIG. 16 is a schematic plan view of a pixel in accordance with an embodiment. FIG. 17 is a schematic plan view of a unit pixel in accordance with an embodiment, and is a schematic plan view illustrating an enlargement of area Q2 of FIG. 16. FIG. 18 is a schematic cross-sectional view taken along line B1-B1' of FIG. 17. FIG. 19 is a schematic cross-sectional view taken along line B2-B2' of FIG. 17. FIG. 20 is a schematic cross-sectional view of a unit pixel in accordance with an embodiment, and is a schematic cross-sectional view corresponding to line B1-B1' of FIG. 17.

Referring to FIGS. 16 to 20, a display device in accordance with an embodiment may include a substrate SUB, and a pixel PXLb provided on the substrate SUB.

The pixel PXLb may include unit pixels UPX1_1, UPX2_1, and UPX3_1. For example, the unit pixels UPX1_1, UPX2_1, and UPX3_1 may include a first unit pixel UPX1_1, a second unit pixel UPX2_1, and a third unit pixel UPX3_1. The structures of the unit pixels UPX1_1, UPX2_1, and UPX3_1 included in the pixel PXLb may be substantially identical or similar to each other, and hereinafter will be described focusing on the structure of the first unit pixel UPX1_1, and the description thereof may also be equally applied to the second and third unit pixels UPX2_1 and UPX3_1.

The first unit pixel UPX1_1 may include a pixel circuit layer PCL disposed on the substrate SUB, and a display element layer DPL disposed on the pixel circuit layer PCL.

The display element layer DPL may include first and second electrodes RFE1_1 and RFE2_1, light emitting elements LD, and third and fourth electrodes CTE1_1 and CTE2_1.

The first electrode RFE1_1 and the second electrode RFE2_1 may be disposed at positions spaced apart from each other in a plan view. The second electrode RFE2_1 may be disposed to enclose at least a portion of the first electrode RFE1_1.

In detail, the first electrode RFE1_1 may include a first central electrode RFE1A, a first peripheral electrode RFE1C, and a first connection electrode RFE1B configured to connect the first central electrode RFE1A and the first peripheral electrode RFE1C to each other.

The first central electrode RFE1A may be disposed in a central portion of the first unit pixel UPX1_1 and formed in a circular shape in a plan view. The first central electrode RFE1A may be disposed to overlap the contact hole CTH.

The first peripheral electrode RFE1C may be disposed to enclose at least a portion of the first central electrode RFE1A. The first peripheral electrode RFE1C may be formed in a ring shape that is open on one side in a plan view. For example, the first peripheral electrode RFE1C generally has a ring shape, which is open in a direction opposite to the first direction DR1 based on the first central electrode RFE1A. For example, the ring shape that is open on one side may be a Corbino disk shape or a Landolt ring shape. However, the shape of the first peripheral electrode RFE1C is not limited thereto, and two or more open areas may be present.

The first connection electrode RFE1B may be an electrode configured to connect the first central electrode RFE1A and the first peripheral electrode RFE1C to each other. The first connection electrode RFE1B may extend in the first direction DR1, and be disposed in the first direction DR1 based on the first central electrode RFE1A. In other words, a position at which the first connection electrode RFE1B is formed may be opposite to the open area of the first peripheral electrode RFE1C. However, the position and shape of the first connection electrode RFE1B are not limited thereto. For example, the first connection electrode RFE1B may extend in the second direction DR2 between the first central electrode RFE1A and the first peripheral electrode RFE1C. Furthermore, the first connection electrode RFE1B may have a curved shape or a zigzag shape rather than having a linear shape.

The second electrode RFE2_1 may include a second central electrode RFE2A, a second peripheral electrode RFE2C, and a second connection electrode RFE2B configured to connect the second central electrode RFE2A and the second peripheral electrode RFE2C to each other.

The second central electrode RFE2A may generally have a ring shape and be disposed to enclose at least a portion of the first central electrode RFE1A. The second central electrode RFE2A may not overlap the first connection electrode RFE1B in a plan view, and have an open area at a position at which the first connection electrode RFE1B is disposed. In other words, the second central electrode RFE2A may have a ring shape which is open on one side in a plan view.

The second peripheral electrode RFE2C may be disposed to enclose the first peripheral electrode RFE1C. In other words, the second peripheral electrode RFE2C may be disposed to enclose the first central electrode RFE1A and the second central electrode RFE2A.

The second connection electrode RFE2B may be an electrode configured to connect the second central electrode RFE2A and the second peripheral electrode RFE2C to each other. The second connection electrode RFE2B may be disposed in the open area of the first peripheral electrode RFE1C. In other words, the second connection electrode RFE2B may be spaced apart from the first peripheral electrode RFE1C in a plan view. The second connection electrode RFE2B may extend in the first direction DR1, in the same manner as that of the first connection electrode RFE1B, but the disclosure is not limited thereto. For example, the second connection electrode RFE2B may be formed in an area corresponding to the position of the open area of the first peripheral electrode RFE1C. The second connection electrode RFE2B may have various shapes, and have a curved shape or a zigzag shape rather than having a linear shape.

The light emitting elements LD may be disposed on the first electrode RFE1_1 and the second electrode RFE2_1. In detail, the light emitting elements LD may be disposed between the first central electrode RFE1A and the second central electrode RFE2A, between the second central electrode RFE2A and the first peripheral electrode RFE1C, and between the first peripheral electrode RFE1C and the second peripheral electrode RFE2C. Furthermore, some light emitting elements LD may also be disposed between the first connection electrode RFE1B and the second central electrode RFE2A and between the second connection electrode RFE2B and the first peripheral electrode RFE1C.

The light emitting elements LD may be radially disposed around the first central electrode RFE1A along the shapes of the first electrode RFE1_1 and the second electrode RFE2_1. Distances between the light emitting elements LD may differ from each other, but the disclosure is not limited thereto.

The light emitting elements LD disposed between the first electrode RFE1_1 and the second electrode RFE2_1 may emit light having a luminance corresponding to driving current provided through the first electrode RFE1_1 and the second electrode RFE2_1.

A third electrode CTE1_1 and a fourth electrode CTE2_1 may be disposed over the first electrode RFE1_1, the second electrode RFE2_1, and the light emitting elements LD. The third electrode CTE1_1 and the fourth electrode CTE2_1 may be disposed to overlap the first electrode RFE1_1 and the second electrode RFE2_1, and have shapes similar thereto. The third electrode CTE1_1 and the fourth electrode CTE2_1 may be formed at positions spaced apart from each other in a plan view.

For example, the third electrode CTE1_1 may include a third central electrode CTE1A, a third connection electrode CTE1B, and a third peripheral electrode CTE1C. The fourth electrode CTE2_1 may include a fourth central electrode CTE2A, a fourth connection electrode CTE2B, and a fourth peripheral electrode CTE2C.

The third central electrode CTE1A, the third connection electrode CTE1B, and the third peripheral electrode CTE1C of the third electrode CTE1_1 may be disposed to respectively overlap the first central electrode RFE1A, the first peripheral electrode RFE1C, and the first connection electrode RFE1B of the first electrode RFE1_1 and have shapes similar thereto. Furthermore, the fourth central electrode CTE2A, the fourth connection electrode CTE2B, and the fourth peripheral electrode CTE2C of the fourth electrode CTE2_1 may be disposed to respectively overlap the second central electrode RFE2A, the second peripheral electrode RFE2C, and the second connection electrode RFE2B of the second electrode RFE2_1 and have shapes similar thereto.

The third electrode CTE1_1 may contact the first end EP1 of the light emitting element LD and the first electrode RFE1_1, and the fourth electrode CTE2_1 may contact the second end EP2 of the light emitting element LD and the second electrode RFE2_1, so that driving current provided from the first electrode RFE1_1 and the second electrode RFE2_1 may be transmitted to the light emitting element LD.

The first unit pixel UPX1_1 may further include a first bank BNK1_1 disposed between the first electrode RFE1_1 and the pixel circuit layer PCL, and a second bank BNK2_1 disposed between the second electrode RFE2_1 and the pixel circuit layer PCL.

The first bank BNK1_1 and the second bank BNK2_1 may be disposed at positions spaced apart from each other. The first bank BNK1_1 and the second bank BNK2_1 may be spaced apart from each other by a distance equal to or greater than the length of the light emitting element LD so as to provide space in which the light emitting elements LD can be disposed. The first bank BNK1_1 and the second bank BNK2_1 may be covered with the first electrode RFE1_1 and the second electrode RFE2_1, and have similar planar shapes.

However, the shapes of the first bank BNK1_1 and the second bank BNK2_1 are not limited to the foregoing. For example, as illustrated in FIG. 20 illustrating a first unit pixel UPX1_1a, a second bank BNK2_1a formed to overlap the second peripheral electrode RFE2C may further extend outward. Hence, at least a portion of the second bank BNK2_1a may overlap the partition wall PW. As described above with reference to FIG. 20, in case that the second bank BNK2_1a is formed to overlap the partition wall PW, a defect in which a light emitting element LD is abnormally disposed during the process of manufacturing the display device may be prevented from occurring, and the display quality and luminance of the display device may be enhanced.

According to the foregoing embodiment, the pixel PXLb of the display device may include the unit pixels UPX1_1, UPX2_1, and UPX3_1, and each of the unit pixels UPX1_1, UPX2_1, and UPX3_1 may include the first electrode RFE1_1 and the second electrode RFE2_1. Here, the first electrode RFE1_1 may include the first central electrode RFE1A, the first peripheral electrode RFE1C, and the first connection electrode RFE1B. The second electrode RFE2_1 may include the second central electrode RFE2A, the second peripheral electrode RFE2C, and the second connection electrode RFE2B. The second central electrode RFE2A may enclose at least a portion of the first central electrode RFE1A. The first peripheral electrode RFE1C may enclose at least a portion of the second central electrode RFE2A. The second peripheral electrode RFE2C may enclose at least a portion of the first peripheral electrode RFE1C. With the foregoing structure, the area of the space in which the light emitting elements LD are validly disposed between the first electrode RFE1_1 and the second electrode RFE2_1 may be increased, and the number of light emitting elements LD disposed in each of the unit pixels may be increased. Consequently, the display luminance of the display device may be improved.

Furthermore, the light emitting elements LD disposed between the first electrode RFE1_1 and the second electrode RFE2_1 may be radially disposed based on the first central electrode RFE1A. In other words, the light emitting elements LD may be prevented from being disposed (or aligned) to be biased in a specific direction. Therefore, light emitted from each of the light emitting elements LD may be prevented from being concentrated in a specific direction. Hence, the quantity (or intensity) of light emitted from the pixel PXLb may be substantially equal or similar to the quantity (or intensity) of light emitted from an adjacent pixel. Therefore, the display device in accordance with an embodiment may have uniform emission distribution over the overall area thereof.

Figure 21:
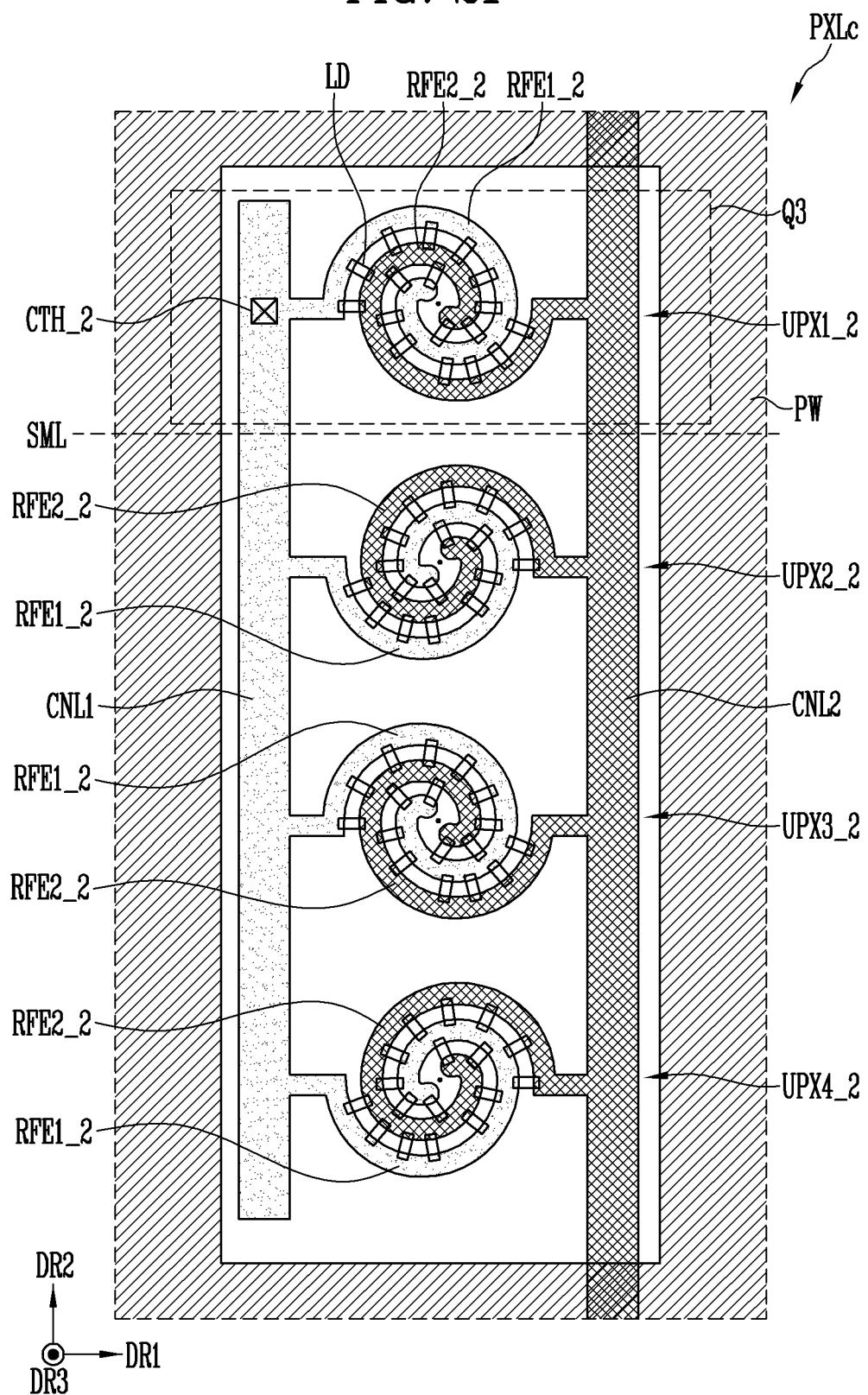
FIG. 21 is a schematic plan view of a pixel in accordance with an embodiment.
Figure 22:
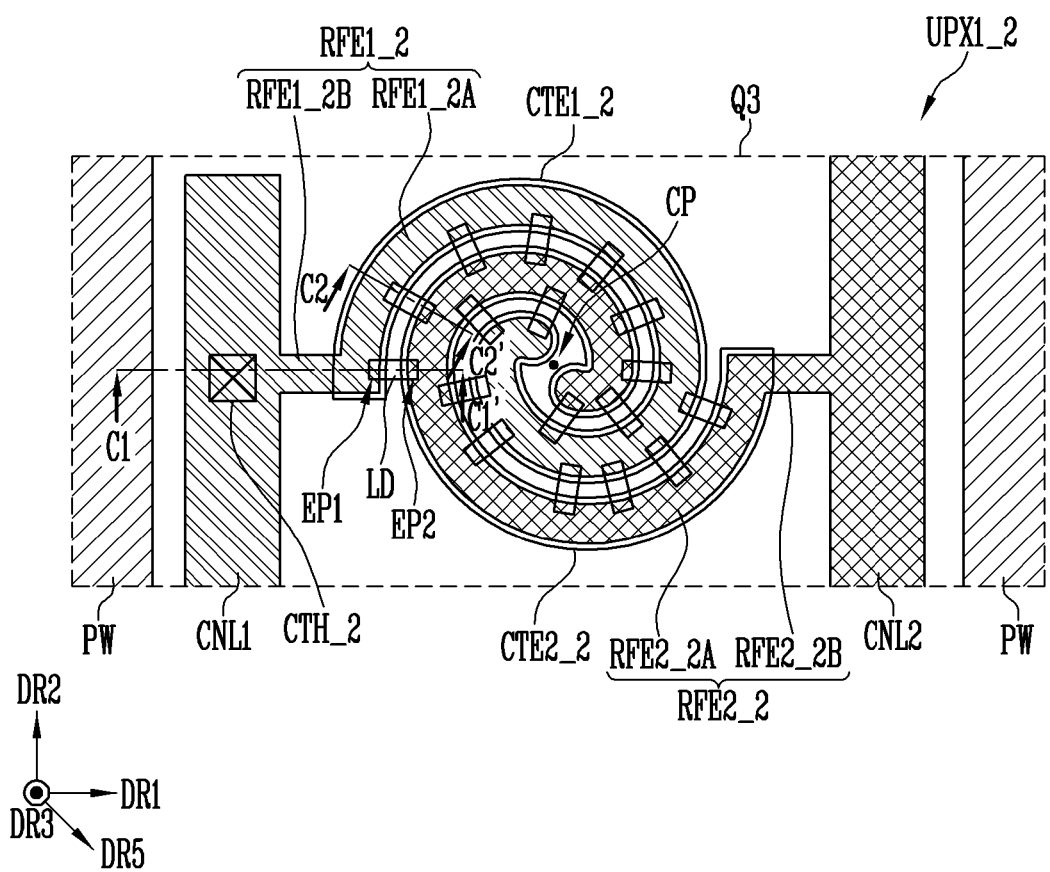
FIG. 22 is a schematic plan view of a pixel in accordance with an embodiment, and is a plan view showing an enlargement of area Q3 of FIG.
Figure 23:
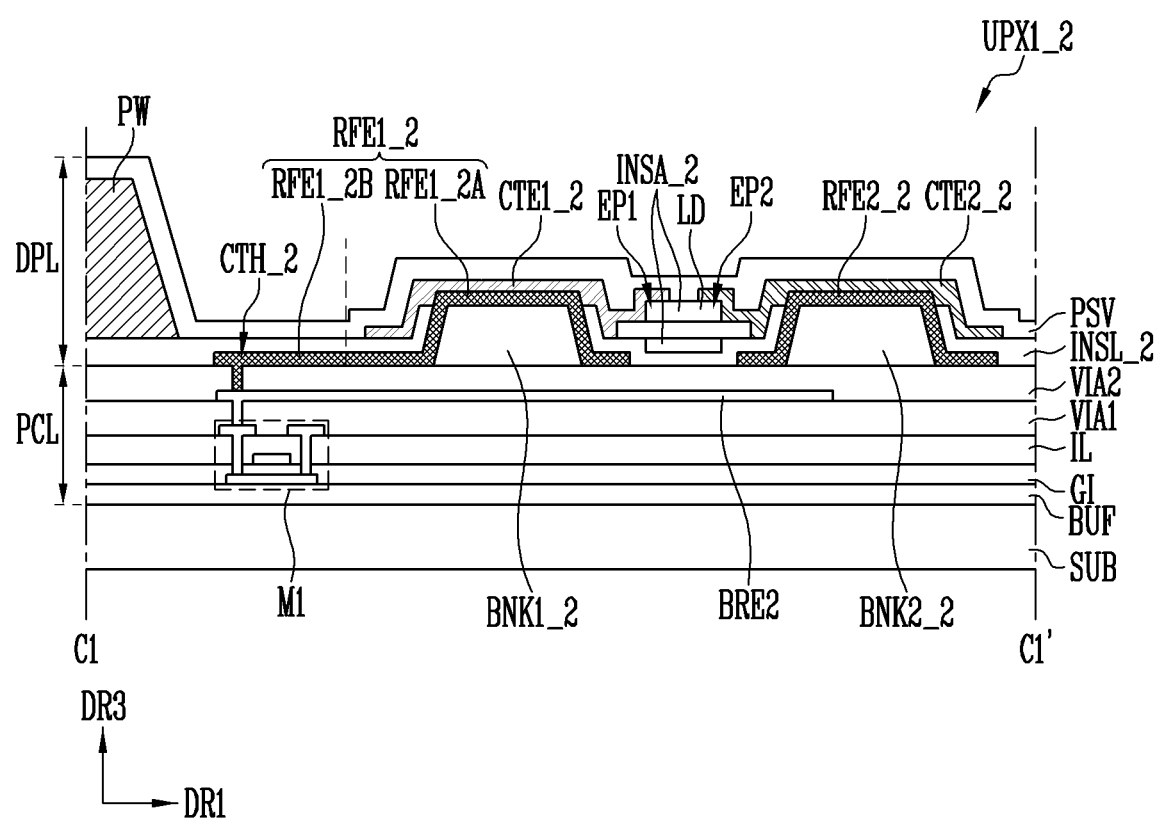
FIG. 23 is a schematic cross-sectional view taken along line C1-C1' of FIG. 22.
Figure 24:
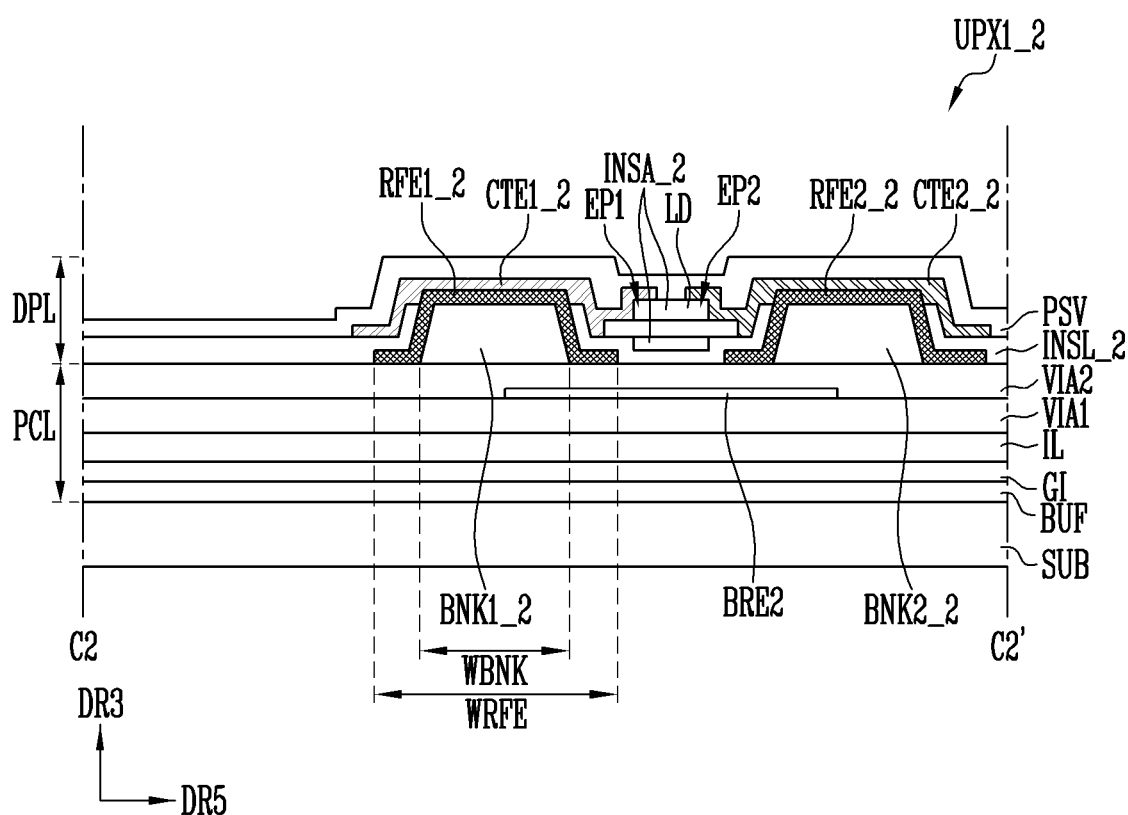
FIG. 24 is a schematic cross-sectional view taken along line C2-C2' of FIG. 22.
Figure 25:
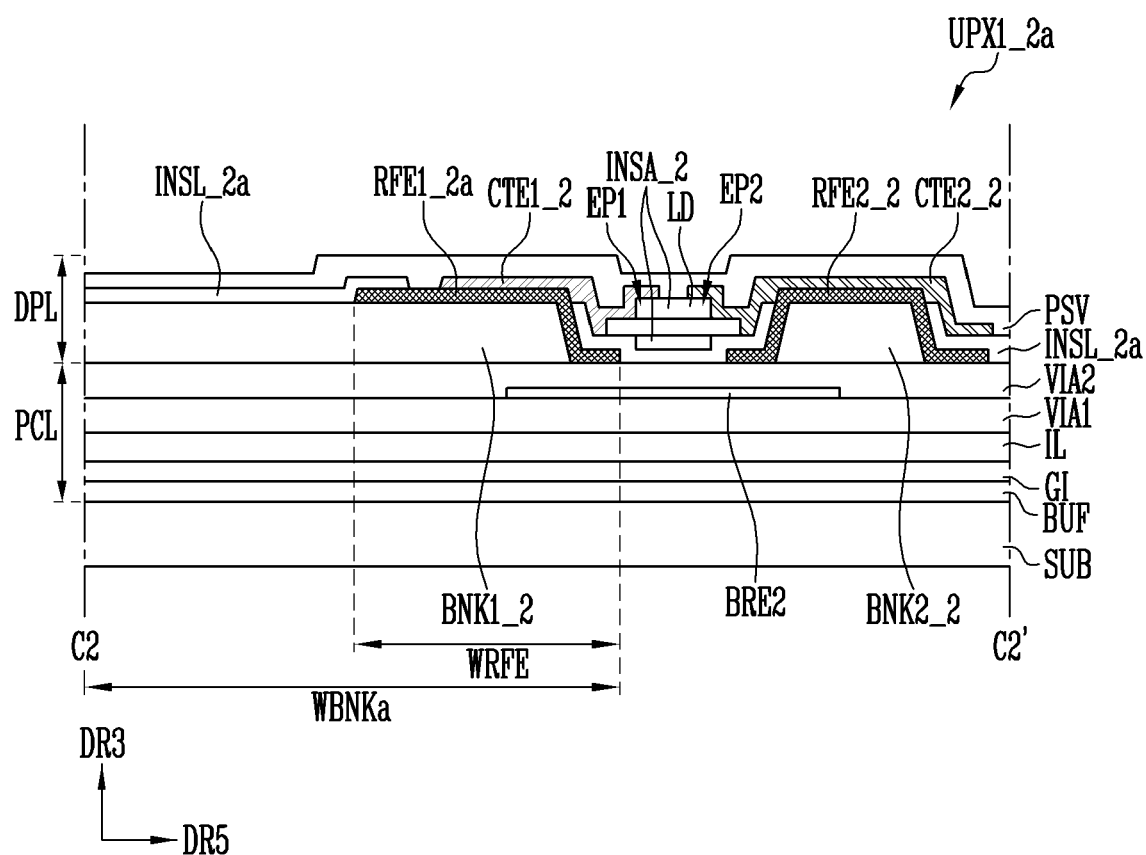
FIG. 25 is a schematic cross-sectional view of a pixel in accordance with an embodiment, and is a cross-sectional view corresponding to line C2-C2' of FIG. 22.

FIG. 21 is a schematic plan view of a pixel in accordance with an embodiment. FIG. 22 is a schematic plan view of a unit pixel in accordance with an embodiment, and is a schematic plan view illustrating an enlargement of area Q3 of FIG. 21. FIG. 23 is a schematic cross-sectional view taken along line C1-C1' of FIG. 22. FIG. 24 is a schematic cross-sectional view taken along line C2-C2' of FIG. 22. FIG. 25 is a schematic cross-sectional view of a unit pixel in accordance with an embodiment, and is a schematic cross-sectional view corresponding to line C2-C2' of FIG. 22.

Referring to FIGS. 21 to 25, a display device in accordance with an embodiment may include a substrate SUB, and a pixel PXLc provided on the substrate SUB.

The pixel PXLc may include unit pixels UPX1_2, UPX2_2, UPX3_2, and UPX4_2. For example, the unit pixels UPX1_2, UPX2_2, UPX3_2, and UPX4_2 may include a first unit pixel UPX1_2, a second unit pixel UPX2_2, a third unit pixel UPX3_2, and a fourth unit pixel UPX4_2. The structures of the unit pixels UPX1_2, UPX2_2, UPX3_2, and UPX4_2 included in the pixel PXLc may be substantially identical or similar to each other, and thus hereinafter will be described, focusing on the structure of the first unit pixel UPX1_2, and the description thereof may also be equally applied to the second to fourth unit pixels UPX2_2, UPX3_2, and UPX4_2.

The first unit pixel UPX1_2 may include a pixel circuit layer PCL disposed on the substrate SUB, and a display element layer DPL disposed on the pixel circuit layer PCL.

The display element layer DPL may include first and second electrodes RFE1_2 and RFE2_2, light emitting elements LD, and third and fourth electrodes CTE1_2 and CTE2_2.

The first electrode RFE1_2 and the second electrode RFE2_2 may be disposed at positions spaced apart from each other in a plan view. Furthermore, the first electrode RFE1_2 and the second electrode RFE2_2 each may have a spiral shape wound (or extending) in a clockwise direction or a counterclockwise direction while receding from a central point CP. The first electrode RFE1_2 and the second electrode RFE2_2 may be wound in a same direction.

In detail, the first electrode RFE1_2 may include a first spiral electrode RFE1_2A and a first connection electrode RFE1_2B.

The first spiral electrode RFE1_2A may have a spiral shape wound in a counterclockwise direction while receding from the center point CP.

The first connection electrode RFE1_2B may be an electrode configured to connect the first spiral electrode RFE1_2A and a first connection line CNL1 to each other, and may be a linear electrode extending in the first direction DR1.

The first connection line CNL1 may be electrically connected, through a contact hole CTH_2, to the second bridge line BRE2 and the first transistor M1 disposed on the pixel circuit layer PCL. The first connection line CNL1 may be supplied with driving current from the first transistor M1, and provide the supplied driving current to the respective first electrodes RFE1_2 of the unit pixels UPX1_2, UPX2_2, and UPX3_2. In other words, the respective first electrodes RFE1_2 of the unit pixels UPX1_2, UPX2_2, and UPX3_2 may be electrically connected to each other by the first connection line CNL1 and be supplied with a same driving current.

The second electrode RFE2_2 may include a second spiral electrode RFE2_2A and a second connection electrode RFE2_2B.

The second spiral electrode RFE2_2A may have a spiral shape wound in a counterclockwise direction while receding from the center point CP, in the same manner as that of the first spiral electrode RFE1_2A. In this case, the second spiral electrode RFE2_2A may be spaced apart from the first spiral electrode RFE1_2A, and the first spiral electrode RFE1_2A and the second spiral electrode RFE2_2A may form a spiral shape in which the first and second spiral electrodes RFE1_2A and RFE2_2A engage with each other and be wound. For example, the second spiral electrode RFE2_2A may be point symmetric to the first spiral electrode RFE1_2A based on the center point CP, but the disclosure is not limited thereto.

The second connection electrode RFE2_2B may be an electrode configured to connect the second spiral electrode RFE2_2A and a second connection line CNL2 to each other. The second connection line CNL2 may extend in the second direction DR2 and be supplied with a voltage of the second driving power supply VSS (see FIG. 3A) through a contact hole or a separate connector that is formed outside the pixel PXLc. However, the disclosure is not limited thereto, and the second connection line CNL2 may also receive a voltage through a contact hole or a separate connector that is formed inside the pixel PXLc.

An insulating layer INSL_2 may be disposed on the first electrode RFE1_2 and the second electrode RFE2_2. Openings OP1 and OP2 (see FIG. 10) may be formed in the insulating layer INSL_2 to expose at least portions of the first electrode RFE1_2 and the second electrode RFE2_2. The openings of the insulating layer INSL_2 may also be formed in a spiral shape corresponding to that of openings of the first electrode RFE1_2 and the second electrode RFE2_2.

The light emitting elements LD may be disposed on the insulating layer INSL_2. The light emitting elements LD may be formed between the first electrode RFE1_2 and the second electrode RFE2_2, and be disposed in a shape corresponding to the spiral shapes of the first electrode RFE1_2 and the second electrode RFE2_2. The light emitting elements LD may be approximately radially disposed around the center point CP, but the disclosure is not limited thereto.

A fixing layer INSA_2 may be disposed on the light emitting element LD. The fixing layer INSA_2 may also be formed in a shape corresponding to a spiral shape between the first electrode RFE1_2 and the second electrode RFE2_2. The fixing layer INSA_2 may be disposed along an area in which the light emitting elements LD are disposed, and may fix the light emitting elements LD so that the light emitting elements LD can be stably disposed on the first electrode RFE1_2 and the second electrode RFE2_2.

A third electrode CTE1_2 and a fourth electrode CTE2_2 may be disposed over the first electrode RFE1_2, the second electrode RFE2_2, and the light emitting elements LD. The third electrode CTE1_2 and the fourth electrode CTE2_2 may be disposed to overlap the first electrode RFE1_2 and the second electrode RFE2_2, and have shapes similar thereto. In other words, the third electrode CTE1_2 and the fourth electrode CTE2_2 each may also have a spiral shape wound in a counterclockwise direction. Furthermore, the third electrode CTE1_2 and the fourth electrode CTE2_2 may be formed at positions spaced apart from each other in a plan view.

The third electrode CTE1_2 may contact the first end EP1 of the light emitting element LD and the first electrode RFE1_2, and the fourth electrode CTE2_2 may contact the second end EP2 of the light emitting element LD and the second electrode RFE2_2, so that driving current provided from the first electrode RFE1_2 and the second electrode RFE2_2 may be transmitted to the light emitting element LD.

The first unit pixel UPX1_2 may further include a first bank BNK1_2 disposed between the first electrode RFE1_2 and the pixel circuit layer PCL, and a second bank BNK2_2 disposed between the second electrode RFE2_2 and the pixel circuit layer PCL.

The first bank BNK1_2 and the second bank BNK2_2 may be disposed at positions spaced apart from each other. The first bank BNK1_2 and the second bank BNK2_2 may be spaced apart from each other by a distance equal to or greater than the length of the light emitting element LD so as to provide space in which the light emitting elements LD can be disposed. The first bank BNK1_2 and the second bank BNK2_2 may be covered with the first electrode RFE1_2 and the second electrode RFE2_2, and have similar planar shapes similar to those of the first electrode RFE1_2 and the second electrode RFE2_2.

However, the shapes of the first bank BNK1_2 and the second bank BNK2_2 are not limited to the foregoing. For example, as illustrated in FIG. 25 illustrating a first unit pixel UPX1_2a, at least portions of the first bank BNK1_2 and the second bank BNK2_2 may further extend outward. Here, an area in which the bank extends may be an area where the light emitting elements LD are not disposed between the first bank BNK1_2 and the second bank BNK2_2. In other words, the portions of the first bank BNK1_2 and the second bank BNK2_2 that are disposed in the perimeter of the first unit pixel UPX1_2a may extend outward.

For example, as illustrated in FIG. 24, a width WBNK of the first bank BNK1_2 may be less than a width WRFE of the first electrode RFE1_2. As another example, as illustrated in FIG. 25, the first bank BNK1_2 may extend outward (or in a direction opposite to a fifth direction DR5). A first electrode RFE1_2a and an insulating layer INSL_2a may cover at least a portion of the extended first bank BNK1_2. In other words, a width WBNKa of the first bank BNK1_2 may be greater than a width WRFE of the first electrode RFE1_2a.

In case that the first bank BNK1_2 and the second bank BNK2_2 extend outward, a defect in which a light emitting element LD is abnormally disposed during a process of manufacturing the display device may be prevented from occurring, and the display quality and the luminance of the display device may be enhanced.

As illustrated in FIGS. 21 and 22, the directions in which the electrodes of adjacent unit pixels are wound may be different from each other. For example, the first electrode RFE1_2 and the second electrode RFE2_2 of the first unit pixel UPX1_2 each may have a spiral shape wound in a counterclockwise direction while receding from the center point CP. On the other hand, the first electrode RFE1_2 and the second electrode RFE2_2 of the second unit pixel UPX2_2 adjacent to the first unit pixel UPX1_2 each may have a spiral shape wound in a clockwise direction while receding from the center point CP.

The first and second electrodes RFE1_2 and RFE2_2 of the first unit pixel UPX1_2 may be line symmetric to the first and second electrodes RFE1_2 and RFE2_2 of the second unit pixel UPX2_2 based on a symmetry line SML. Hence, the second electrode RFE2_2 of the first unit pixel UPX1_2 may face the second electrode RFE2_2 of the second unit pixel UPX2_2.

For example, in case that the first and second electrodes RFE1_2 and RFE2_2 of the first unit pixel UPX1_2 and the first and second electrodes RFE1_2 and RFE2_2 of the second unit pixel UPX2_2 are wound in a same direction, different electrodes may face each other. For example, the second electrode RFE2_2 of the first unit pixel UPX1_2 and the first electrode RFE1_2 of the second unit pixel UPX2_2 may face each other.

During a process of aligning (or disposing) the light emitting elements LD, polarities of alignment voltages to be applied to different electrodes may differ from each other. Some light emitting elements LD may be disposed between the first unit pixel UPX1_2 and the second unit pixel UPX2_2 by an electric field formed between the second electrode RFE2_2 of the first unit pixel UPX1_2 and the first electrode RFE1_2 of the second unit pixel UPX2_2. In this case, the light emitting elements LD that are disposed between the first unit pixel UPX1_2 and the second unit pixel UPX2_2 cannot be normally supplied with driving current and thus cannot emit light. As the number of such light emitting elements LD is increased, the display quality and the luminance of the display device may deteriorate.

Given this, in the embodiment, the directions in which the electrodes of adjacent unit pixels are wound may differ from each other so that the same polarities of the unit pixels UPX1_2, UPX2_2, UPX3_2, and UPX4_2 face each other. Consequently, the light emitting elements LD may be prevented from being abnormally aligned (or disposed) during the process of aligning (or disposing) the light emitting elements LD. Therefore, the display quality and luminance of the display device may be improved.

According to the foregoing embodiment, the pixel PXLc of the display device may include the unit pixels UPX1_2, UPX2_2, UPX3_2, and UPX4_2, and each of the unit pixels UPX1_2, UPX2_2, UPX3_2, and UPX4_2 may include the first electrode RFE1_2 and the second electrode RFE2_2. Here, the first electrode RFE1_2 and the second electrode RFE2_2 each may have a spiral shape wound (or extending) in a clockwise direction or a counterclockwise direction while receding from a central point CP. With the structure in which the first electrode RFE1_2 and the second electrode RFE2_2 engage with each other and are wound, the area of the space in which the light emitting elements LD are validly disposed between the first electrode RFE1_2 and the second electrode RFE2_2 may be increased, and the number of light emitting elements LD disposed in each of the unit pixels may be increased. Consequently, the display luminance of the display device may be improved.

Furthermore, the light emitting elements LD disposed between the first electrode RFE1_2 and the second electrode RFE2_2 may be radially disposed based on the center point CP. In other words, the light emitting elements LD may be prevented from being disposed (or aligned) to be biased in a specific direction. Therefore, light emitted from each of the light emitting elements LD may be prevented from being concentrated in a specific direction. Hence, the quantity (or intensity) of light emitted from the pixel PXLc may be substantially equal or similar to the quantity (or intensity) of light emitted from an adjacent pixel. Therefore, the display device in accordance with an embodiment may have uniform emission distribution over the overall area thereof.

The light emitting elements LD may be prevented from being disposed (or aligned) to be biased in a specific direction. Therefore, light emitted from each of the light emitting elements LD may be prevented from being concentrated in a specific direction. Hence, the quantity (or intensity) of light emitted from each of the unit pixels UPX1, UPX2, and UPX3 may be substantially identical or similar to the quantity (or intensity) of light emitted from an adjacent pixel. Therefore, the display device in accordance with an embodiment may have uniform emission distribution over the overall area thereof.

Although the embodiments of the disclosure have been disclosed, those skilled in the art will appreciate that the disclosure can be implemented as other concrete forms, without departing from the scope and spirit of the disclosure as disclosed in the accompanying claims. Therefore, it should be understood that the embodiments are only for illustrative purpose and do not limit the bounds of the disclosure.

What is claimed is:

1. A display device comprising:
pixels disposed on a substrate, wherein
each of the pixels comprises:
a first electrode;
a second electrode spaced apart from the first electrode and enclosing a perimeter of the first electrode;
light emitting elements disposed between the first electrode and the second electrode, and each including a first end and a second end;
a third electrode overlapping the first electrode and the first end of each of the light emitting elements in a plan view, and electrically contacting the first electrode and the first end of each of the light emitting elements; and
a fourth electrode overlapping the second electrode and the second end of each of the light emitting elements in a plan view, and electrically contacting the second electrode and the second end of each of the light emitting elements, and
the light emitting elements are radially disposed around the first electrode.

2. The display device according to claim 1, wherein the first electrode comprises:
a first center electrode having a circular shape in a plan view;
a first peripheral electrode enclosing at least a portion of the first center electrode; and
a first connection electrode electrically connecting the first center electrode and the first peripheral electrode to each other.

3. The display device according to claim 2, wherein the second electrode comprises:
a second center electrode enclosing at least a portion of the first center electrode;
a second peripheral electrode enclosing at least a portion of the second center electrode; and
a second connection electrode electrically connecting the second center electrode and the second peripheral electrode to each other.

4. The display device according to claim 3, wherein the second center electrode has a ring shape that is open on at least one side in a plan view.

5. The display device according to claim 3, wherein the first peripheral electrode encloses at least a portion of the second center electrode, and has a ring shape that is open on at least one side in a plan view.

6. The display device according to claim 3, wherein the second peripheral electrode is disposed outside the first peripheral electrode.

7. The display device according to claim 3, wherein the light emitting elements are disposed in at least one of an area between the first center electrode and the second center electrode, an area between the second center electrode and the first peripheral electrode, and an area between the first peripheral electrode and the second peripheral electrode.

8. The display device according to claim 1, further comprising:
an insulating layer disposed on the first electrode and the second electrode, wherein
the insulating layer includes:
a first opening exposing at least a portion of the first electrode; and
a second opening exposing at least a portion of the second electrode,
the third electrode electrically contacts the first electrode through the first opening, and
the fourth electrode electrically contacts the second electrode through the second opening.

9. The display device according to claim 8, further comprising:
a fixing layer disposed on the insulating layer and the light emitting elements,
wherein the fixing layer contacts at least a portion of an outer circumferential surface of each of the light emitting elements and allows the first end and the second end to be exposed.

10. The display device according to claim 9, wherein
the fixing layer includes organic material, and
at least a portion of the fixing layer is disposed between the light emitting elements and the insulating layer.

11. The display device according to claim 9, wherein
the fixing layer includes inorganic material, and
a void is at least partially disposed between the light emitting elements and the insulating layer.

12. The display device according to claim 8, wherein
each of the pixels further comprises:
a first bank disposed between the substrate and the first electrode; and
a second bank disposed between the substrate and the second electrode, and
the light emitting elements are disposed between the first bank and the second bank.

13. The display device according to claim 12, further comprising:
a partition wall enclosing at least some of the pixels, and disposed on the insulating layer,
wherein at least a portion of the second bank overlaps the partition wall in a plan view.

14. The display device according to claim 1, wherein the fourth electrode is spaced apart from the third electrode, and disposed to enclose a perimeter of the third electrode.

15. The display device according to claim 14, further comprising:
an insulating pattern disposed between the third electrode and the fourth electrode, wherein
the insulating pattern is disposed on one of the third and the fourth electrodes, and
another one of the third and the fourth electrodes is disposed on the insulating pattern.

16. The display device according to claim 1, further comprising:
a driving transistor disposed between the substrate and the pixels, and electrically connected to the light emitting elements, wherein
the driving transistor comprises:
a semiconductor pattern disposed on the substrate;
a gate electrode disposed on the semiconductor pattern; and
a first transistor electrode and a second transistor electrode disposed on the gate electrode, the semiconductor pattern includes:
- a first area electrically contacting the first transistor electrode;
- a second area spaced apart from the first area and electrically contacting the second transistor electrode; and
- a channel area disposed between the first area and the second area, the first transistor electrode is electrically connected to a first bridge line disposed on a layer different from the first transistor electrode, and the first bridge line is electrically connected to one of the first electrode and the second electrode.

17. The display device according to claim 16, wherein the first bridge line electrically contacts the first electrode through a contact hole overlapping the first electrode in a plan view.

18. The display device according to claim 16, wherein
the first transistor electrode is electrically connected to a second bridge line, the second bridge line and the first transistor electrode being disposed on a same layer, the second bridge line is electrically connected to the first electrode, and the first bridge line is electrically connected to the second electrode.

19. A display device comprising:
pixels disposed on a substrate,
wherein each of the pixels comprises:
- a first electrode having a spiral shape wound in a direction that is a clockwise direction or a counter-clockwise direction and receding from a center point in a plan view;
- a second electrode having a spiral shape wound in a direction identical to the direction of the first electrode and receding from the center point in a plan view, and spaced apart from the first electrode; and
- light emitting elements disposed between the first electrode and the second electrode.

20. The display device according to claim 19, wherein
the pixels include a first pixel, and a second pixel adjacent to the first pixel, and a direction in which the first electrode and the second electrode of the first pixel are wound differs from a direction in which the first electrode and the second electrode of the second pixel are wound.

21. The display device according to claim 19, wherein the light emitting elements are radially disposed around the center point.

22. The display device according to claim 19, wherein
the light emitting elements each comprise a first end and a second end, and each of the pixels comprises:
- a third electrode overlapping the first end of each of the light emitting elements and the first electrode in a plan view, and electrically contacting the first electrode and the first end of each of the light emitting elements; and
- a fourth electrode overlapping the second end of each of the light emitting elements and the second electrode in a plan view, and electrically contacting the second electrode and the second end of each of the light emitting elements, and spaced apart from the third electrode.

23. The display device according to claim 22, wherein the third and the fourth electrodes each have a spiral shape wound in a direction identical to a direction of the first and the second electrodes and receding the from center point in a plan view.

24. The display device according to claim 19, wherein each of the pixels comprises:
- a first bank disposed between the substrate and the first electrode; and
- a second bank disposed between the substrate and the second electrode, and the light emitting elements are disposed between the first bank and the second bank.

25. The display device according to claim 24, wherein the first and the second banks each have a spiral shape wound in a direction identical to a direction of the first and the second electrodes and receding from the center point in a plan view.

* * * * *